United States Patent
Shibata

(10) Patent No.: US 8,711,017 B2
(45) Date of Patent: Apr. 29, 2014

(54) SERIAL TRANSMISSION SYSTEM INCLUDING TRANSMITTER APPARATUS AND RECEIVER APPARATUS, FOR USE IN TRANSMISSION OF AV DATA

(71) Applicant: Panasonic Corporation, Osaka (JP)

(72) Inventor: Osamu Shibata, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/680,389

(22) Filed: Nov. 19, 2012

(65) Prior Publication Data

US 2013/0127645 A1    May 23, 2013

(30) Foreign Application Priority Data

Nov. 21, 2011  (JP) ................................ 2011-253613

(51) Int. Cl.
| | |
|---|---|
| H03M 9/00 | (2006.01) |
| H03M 7/30 | (2006.01) |
| H04B 1/707 | (2011.01) |
| H04M 11/06 | (2006.01) |
| H04B 1/66 | (2006.01) |
| H04J 3/06 | (2006.01) |

(52) U.S. Cl.
CPC . *H03M 9/00* (2013.01); *H03M 7/30* (2013.10); *H04B 1/707* (2013.01); *H04B 7/7093* (2013.01); *H04M 11/06* (2013.01); *H04B 1/66* (2013.10); *H04J 3/0608* (2013.01)
USPC .......................................... 341/100; 341/101

(58) Field of Classification Search
CPC .......... H03M 9/00; H03M 7/30; H04B 1/707; H04B 1/7093; H04B 1/1027; H04M 11/06; H04L 1/0026; H04W 24/00; H04J 3/0608
USPC .......... 341/100, 101, 106; 375/267, 143, 152, 375/222, 241; 455/67.13, 423, 501; 370/509
See application file for complete search history.

(56) References Cited

U.S. PATENT DOCUMENTS

2008/0205454 A1* 8/2008 Riedel et al. .................. 370/509

FOREIGN PATENT DOCUMENTS

JP    2003-204363    7/2003

* cited by examiner

*Primary Examiner* — Joseph Lauture
(74) *Attorney, Agent, or Firm* — Wenderoth, Lind & Ponack, L.L.P.

(57) ABSTRACT

A transmitter apparatus is provided for converting parallel data of natural number n×12 bits into n pieces of serial data, and transmitting n transmission signals each of natural number m bits. In the transmitter apparatus, a dividing buffer divides inputted parallel data into n pieces of 12-bit parallel data, and an encoder circuit 12B14B-converts the n pieces of 12-bit parallel data into n pieces of 14-bit parallel data, respectively, and outputs resulting data. A parallel-to-serial converter circuit parallel-to-serial converts the n pieces of 14-bit parallel data into n pieces of 1-bit serial data, respectively, and outputs resulting data, and an m-bit driver circuit amplifies and transmits the n pieces of 1-bit serial data, as n transmission signals each of m bits, respectively, to n transmission paths.

20 Claims, 20 Drawing Sheets

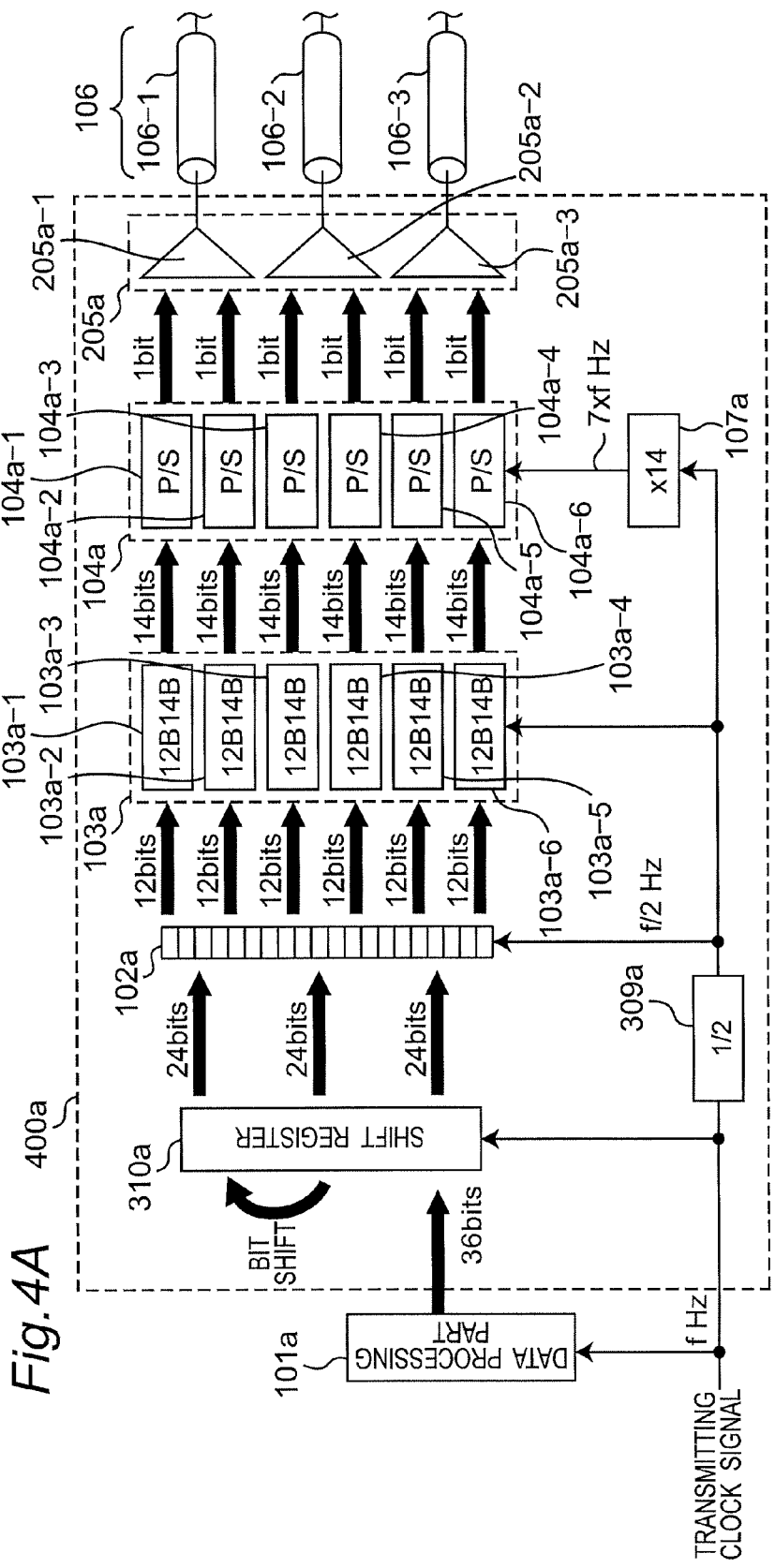

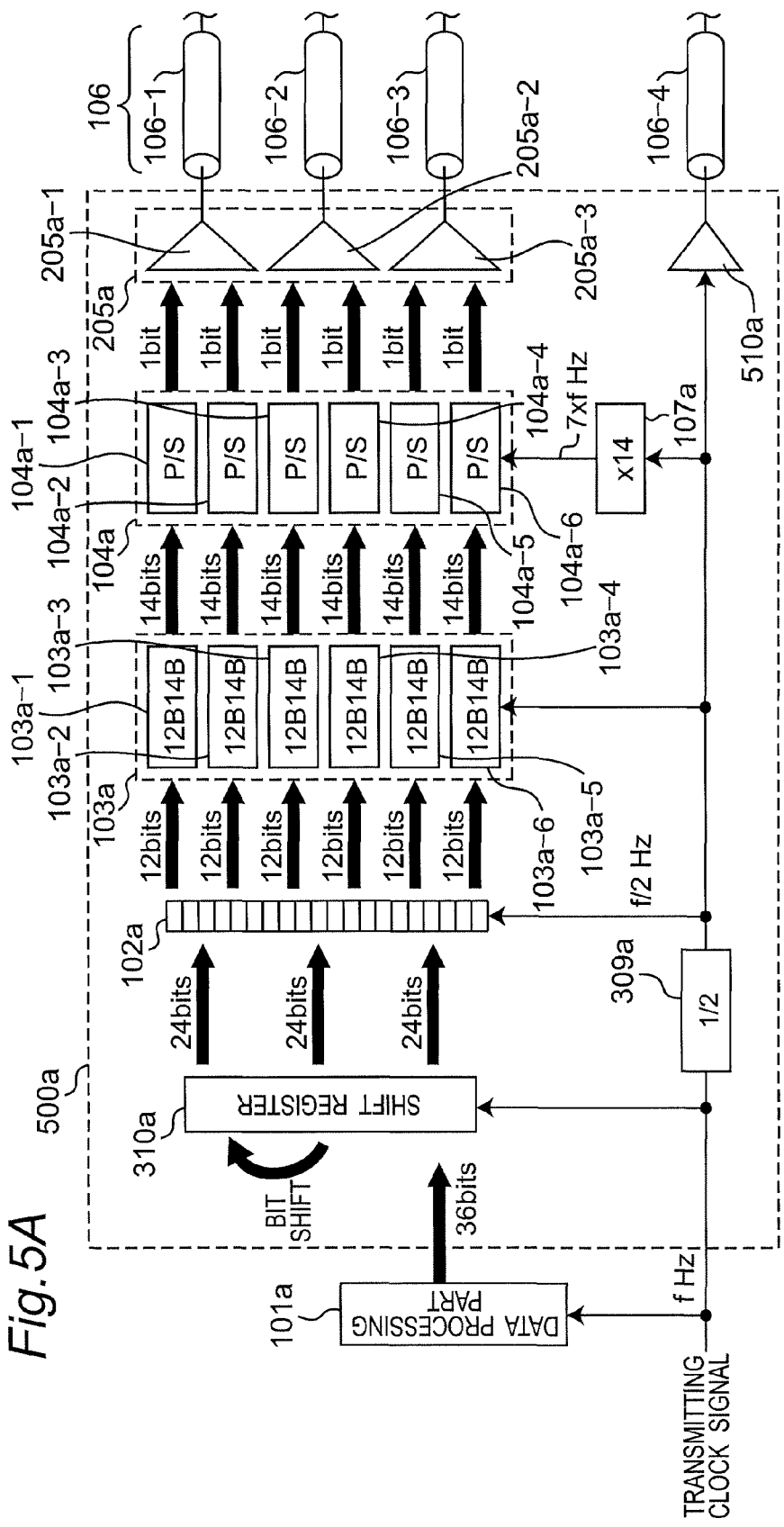

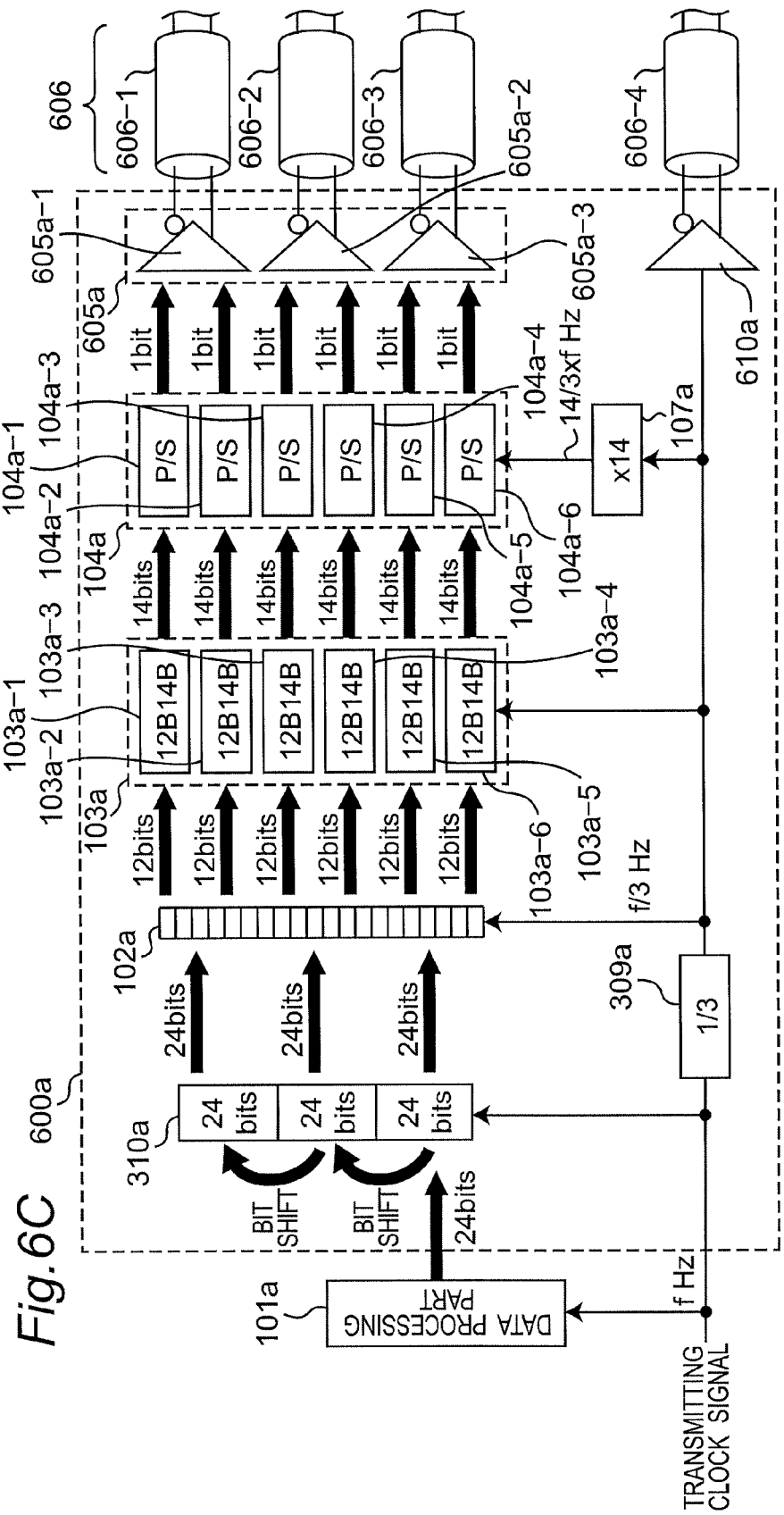

SERIAL TRANSMISSION SYSTEM INCLUDING TRANSMITTER APPARATUS AND RECEIVER APPARATUS, FOR USE IN TRANSMISSION OF AV DATA

CROSS-REFERENCE TO RELATED APPLICATIONS

This is an application which claims priority of Japanese Patent Application No. 2011-253613 as filed on Nov. 21, 2011, the contents of which is incorporated herein by reference.

BACKGROUND OF THE INVENTION

1. Technical Field

The technical field relates to a transmitter apparatus, a receiver apparatus and a serial transmission system, and relates, in particular, to conduct an efficient data encoding and decoding system, multi-valuing, channel reduction, channel changeover, and performing transmission speed suppression when AV data dominated particularly by 24-bit data, 36-bit data and the like is transmitted.

2. Description of the Related Art

In recent years, video data have been made to have higher bits and higher resolutions with improved video picture qualities, and the amount of data to be transmitted by digital interfaces have also been increased. Regarding the bit count of AV data, 8-bit, 16-bit, 24-bit, 32-bit, 36-bit and 48-bit formats per pixel are provided also under the influence of the bit count in the computer and communication fields that are evolving by the exponentiation of two (2, 4, 8, 16, 32, 64, 128, . . . ) Among others, the 24-bit, 36-bit and 48-bit formats are currently dominant, and particularly beneficial in the consumer market are the 24-bit and 36-bit formats.

In the case of HDMI representative of AV digital interfaces, 24-bit video data of eight bits of RGB are fundamentally handled, and 36-bit and 48-bit data can be handled by HDMI1.3 and subsequent versions. Moreover, the resolution of the video format has been also developed, and in accordance with it, the formats that can be handled by HDMI, which have initially been only the 720p HD format and the 1080p full HD format, currently include also transmission in the 4K2K format and the 3D full HD format. In the future, it is demanded to further increase the speed so that transmission in the 3D 4K2K format and the 8K4K format can be achieved.

As an HDMI high-speed transmission technology, high-speed serial transmission is performed by using transmission lines of three channels, and based on processing in 8-bit units under the influence of the architectures of the computer and communication fields, transmission and reception of a total of 24 bits are fundamentally performed by performing TMDS encoding and decoding, or one kind of 8B10B conversion to convert 8-bit parallel data with a DC balance guarantee for each channel into 10 bits. Moreover, it is possible to handle 36-bit data by HDMI1.3 and subsequent versions, forcibly supporting 36 bits by the method of expanding the architecture of 24 bits, increasing the data speed by 1.5 times, and making 24 bits by separating the higher-order bits and the lower-order bits of 36-bit data. Moreover, regarding the data efficiency of HDMI, the effective rate is 80% of the transfer rate since the 8B10B coding is used regardless of the transmission bit count, and the efficiency is deteriorated although data of 20% is utilized for clock regeneration and synchronization.

Considering transmission in the 8K4K format and the like in the future, beneficial technologies are improvements in the data efficiency by reviewing the encoding and decoding system, reductions in the number of channels by multi-valuing or the like, suppression of the transmission speed, simple changeover of channels in accordance with the data bit count, and so on.

Conventionally, the serial transmission system described in a Patent Document 1 of Japanese patent laid-open publication No. JP 2003-204363 A, the 64B66B encoding and decoding system generalized in the communication field and the like can be enumerated as methods for improving the data efficiency. However, the methods have low affinities with the AV data dominated by 24-bit data and 36-bit data, and data processing, such as bit relocation, becomes complicated. Moreover, the 64B66B encoding and decoding system, which is the encoding and decoding system using scrambling, has disadvantages of difficulties in achieving clock regeneration and synchronization because of a large variation in the DC balance and a long bit length.

However, the aforementioned conventional configuration, which handles 8-bit and 64-bit processing units, has had the problems of low affinities with them in handling AV data dominated by 24-bit, 36-bit and 48-bit data, and complicated data processing. Moreover, the configuration has had another problem about how to manage an encoding and decoding system that guarantees a DC balance suitable for the speed increase and can easily be increased in speed also with easy clock regeneration and synchronization.

SUMMARY

An object of the present disclosure is to solve the aforementioned problems and provide a transmitter apparatus capable of improving the data efficiency and simplifying data processing as compared with the transmitter apparatus of the 8B10B encoding and decoding system, a receiver apparatus, and a serial transmission system having these apparatuses.

Another object of the present disclosure is to provide a transmitter apparatus, a receiver apparatus and a serial transmission system capable of further suppressing the transmission speed.

According to a first aspect of the present disclosure, there is provided a transmitter apparatus for converting parallel data of natural number n multiplied by 12 bits into n pieces of serial data, and transmitting n transmission signals each of natural number m bits. The transmitter apparatus includes a dividing buffer, an encoder circuit, a parallel-to-serial converter circuit, and an m-bit driver circuit. The dividing buffer is configured to divide inputted parallel data into n pieces of 12-bit parallel data, and the encoder circuit is configured to 12B14B-convert the n pieces of 12-bit parallel data into n pieces of 14-bit parallel data, respectively, and output resulting data. The parallel-to-serial converter circuit is configured to parallel-to-serial convert the n pieces of 14-bit parallel data into n pieces of 1-bit serial data, respectively, and output resulting data. The m-bit driver circuit configured to amplify and transmit the n pieces of 1-bit serial data, as n transmission signals each of m bits, respectively, to n transmission paths.

According to a second aspect of the present disclosure, there is provided a transmitter apparatus for converting parallel data of natural number p units, whose one unit is parallel data of natural number n multiplied by 12 bits, into (n multiplied by p) pieces of serial data, and transmitting n transmission signals each of natural number m bits. The transmitter apparatus includes a dividing buffer, an encoder circuit, a parallel-to-serial converter circuit, and an m-bit driver circuit. The dividing buffer is configured to divide inputted parallel data into (n multiplied by p) pieces of 12-bit parallel data, and the encoder circuit is configured to 12B14B-convert the (n multiplied by p) pieces of 12-bit parallel data into (n multiplied by p) pieces of 14-bit parallel data, respectively, and output resulting data. The parallel-to-serial converter circuit is configured to parallel-to-serial convert the (n multiplied by p) pieces of 14-bit parallel data into (n multiplied by p) pieces of 1-bit serial data, and output resulting data. The m-bit driver circuit is configured to amplify and transmit the (n multiplied by p) pieces of 1-bit serial data, as n transmission signals each of m bits, respectively, to q transmission paths, where q is a minimum natural number equal to or larger than (n multiplied by P)/m.

According to a third aspect of the present disclosure, there is provided a receiver apparatus for receiving natural number n transmission signals each of natural number m bits, and converting n pieces of serial data into n pieces of parallel data, respectively. The receiver apparatus includes an m-bit receiver circuit, a serial-to-parallel converter circuit, and a decoder circuit. The m-bit receiver circuit is configured to receive n transmission signals each of natural number m bits from n transmission paths, and generate n pieces of 1-bit serial data, respectively. The serial-to-parallel converter circuit is configured to serial-to-parallel convert the n pieces of 1-bit serial data into n pieces of 14-bit parallel data, respectively, and generate a clock signal for synchronization from at least one piece of the n pieces of 1-bit serial data. The decoder circuit is configured to 14B12B-convert the n pieces of 14-bit parallel data into n pieces of 12-bit parallel data, respectively, by using the clock signal for synchronization, and output resulting data.

According to a fourth aspect of the present disclosure, there is provided a receiver apparatus for receiving (n multiplied by p) transmission signals each of natural number m bits, and converting (n multiplied by p) pieces of serial data into (n multiplied by p) pieces of 12-bit parallel data, where n and p are natural numbers. The receiver apparatus includes an rn-bit receiver circuit, a serial-to-parallel converter circuit, and a decoder circuit. The m-bit receiver circuit is configured to receive (n multiplied by p) transmission signals each of natural number m bits from (n multiplied by p) transmission paths, respectively, and generate (n multiplied by p) pieces of 1-bit serial data. The serial-to-parallel converter circuit is configured to serial-to-parallel convert the (n multiplied by p) pieces of 1-bit serial data into (n multiplied by p) pieces of 14-bit parallel data, respectively, and generate a clock signal for synchronization from at least one of the (n multiplied by p) pieces of 1-bit serial data. The decoder circuit is configured to 14B12B-convert the (n multiplied by p) pieces of 14-bit parallel data into (n multiplied by p) pieces of 12-bit parallel data by using the clock signal for synchronization, and output resulting data.

According to a fifth aspect of the present disclosure, there is provided a serial transmission system including a transmitter apparatus and a receiver apparatus. The transmitter apparatus is configured to convert parallel data of natural number n multiplied by 12 bits into n pieces of serial data, and transmit n transmission signals each of natural number m bits. The transmitter apparatus includes a dividing buffer, an encoder circuit, a parallel-to-serial converter circuit, and an m-bit driver circuit. The dividing buffer is configured to divide inputted parallel data into n pieces of 12-bit parallel data, and the encoder circuit is configured to 12B14B-convert the n pieces of 12-bit parallel data into n pieces of 14-bit parallel data, respectively, and output resulting data. The parallel-to-serial converter circuit is configured to parallel-to-serial convert the n pieces of 14-bit parallel data into n pieces of 1-bit serial data, respectively, and output resulting data. The m-bit driver circuit is configured to amplify and transmit the n pieces of 1-bit serial data, as n transmission signals each of m bits, respectively, to n transmission paths.

The receiver apparatus is configured to receive natural number n transmission signals each of natural number m bits, and convert n pieces of serial data into n pieces of parallel data, respectively. The receiver apparatus includes an m-bit receiver circuit, a serial-to-parallel converter circuit, and a decoder circuit. The m-bit receiver circuit is configured to receive n transmission signals each of natural number m bits from n transmission paths, and generate n pieces of 1-bit serial data, respectively. The serial-to-parallel converter circuit is configured to serial-to-parallel convert the n pieces of 1-bit serial data into n pieces of 14-bit parallel data, respectively, and generate a clock signal for synchronization from at least one piece of the n pieces of 1-bit serial data. The decoder circuit is configured to 14B12B-convert the n pieces of 14-bit parallel data into n pieces of 12-bit parallel data, respectively, by using the clock signal for synchronization, and output resulting data.

According to a sixth aspect of the present disclosure, there is provided a serial transmission system including a transmitter apparatus and a receiver apparatus. The transmitter apparatus is configured to convert parallel data of natural number p units, whose one unit is parallel data of natural number n multiplied by 12 bits, into (n multiplied by p) pieces of serial data, and transmit n transmission signals each of natural number m bits. The transmitter apparatus includes a dividing buffer, an encoder circuit, a parallel-to-serial converter circuit, and an m-bit driver circuit. The dividing buffer is configured to divide inputted parallel data into (n multiplied by p) pieces of 12-bit parallel data. The encoder circuit is configured to 12B14B-convert the (n multiplied by p) pieces of 12-bit parallel data into (n multiplied by p) pieces of 14-bit parallel data, respectively, and output resulting data. The parallel-to-serial converter circuit is configured to parallel-to-serial convert the (n multiplied by p) pieces of 14-bit parallel data into (n multiplied by p) pieces of 1-bit serial data, and output resulting data. The m-bit driver circuit is configured to amplify and transmit the (n multiplied by p) pieces of 1-bit serial data, as n transmission signals each of m bits, respectively, to q transmission paths, where q is a minimum natural number equal to or larger than (n multiplied by p)/m.

The receiver apparatus is configured to receive natural number (n multiplied by p) transmission signals each of natural number m bits, and convert (n multiplied by p) pieces of serial data into (n multiplied by p) pieces of 12-bit parallel data, where n and p are natural numbers. The receiver apparatus includes an m-bit receiver circuit, a serial-to-parallel converter circuit, and a decoder circuit. The m-bit receiver circuit is configured to receive (n multiplied by p) transmission signals each of natural number m bits from (n multiplied by p) transmission paths, respectively, and generate (n multiplied by p) pieces of 1-bit serial data. The serial-to-parallel converter circuit is configured to serial-to-parallel convert the (n multiplied by p) pieces of 1-bit serial data into (n multiplied by p) pieces of 14-bit parallel data, respectively, and generate a clock signal for synchronization from at least one of the (n multiplied by p) pieces of 1-bit serial data. The decoder circuit is configured to 14B12B-convert the (n multiplied by p) pieces of 14-bit parallel data into (n multiplied by p) pieces of 12-bit parallel data by using the clock signal for synchronization, and output resulting data.

According to the transmitter apparatus, the receiver apparatus and the serial transmission system of the present disclosure, the serial data transmission that reliably performs clock regeneration and data synchronization with simple data processing while improving the data efficiency can be provided, and the serial transmission can be also provided with a smaller number of channels, allowing the data channel changeover to be easily performed. Moreover, the serial transmission of which the transmission speed is suppressed more than half can be provided, allowing the clock regeneration to be performed more reliably. Furthermore, simplifying the clock transmission, suppressing the interference with the parallel data, and lowering the frequency of noise radiation can be provided, allowing the simplification of high-speed transmission, noise reduction, and high noise resistance to be achieved.

BRIEF DESCRIPTION OF THE DRAWINGS

These and other objects and features of the present disclosure will become clear from the following description taken in conjunction with the embodiments thereof with reference to the accompanying drawings throughout which like parts are designated by like reference numerals, and in which:

FIG. 4A is a block diagram showing a configuration of a transmitter apparatus 400a of a serial transmission system for performing 36-bit data transfer according to a fourth embodiment of the present disclosure;

FIG. 5A is a block diagram showing a configuration of a transmitter apparatus 500a of a serial transmission system for performing 36-bit data transfer according to a fifth embodiment of the present disclosure;

FIG. 6C is a block diagram showing a configuration of a transmitter apparatus 600a of a serial transmission system for performing 24-bit data transfer according to a modified embodiment of the sixth embodiment of the present disclosure.

DETAILED DESCRIPTION

Figure 1A:
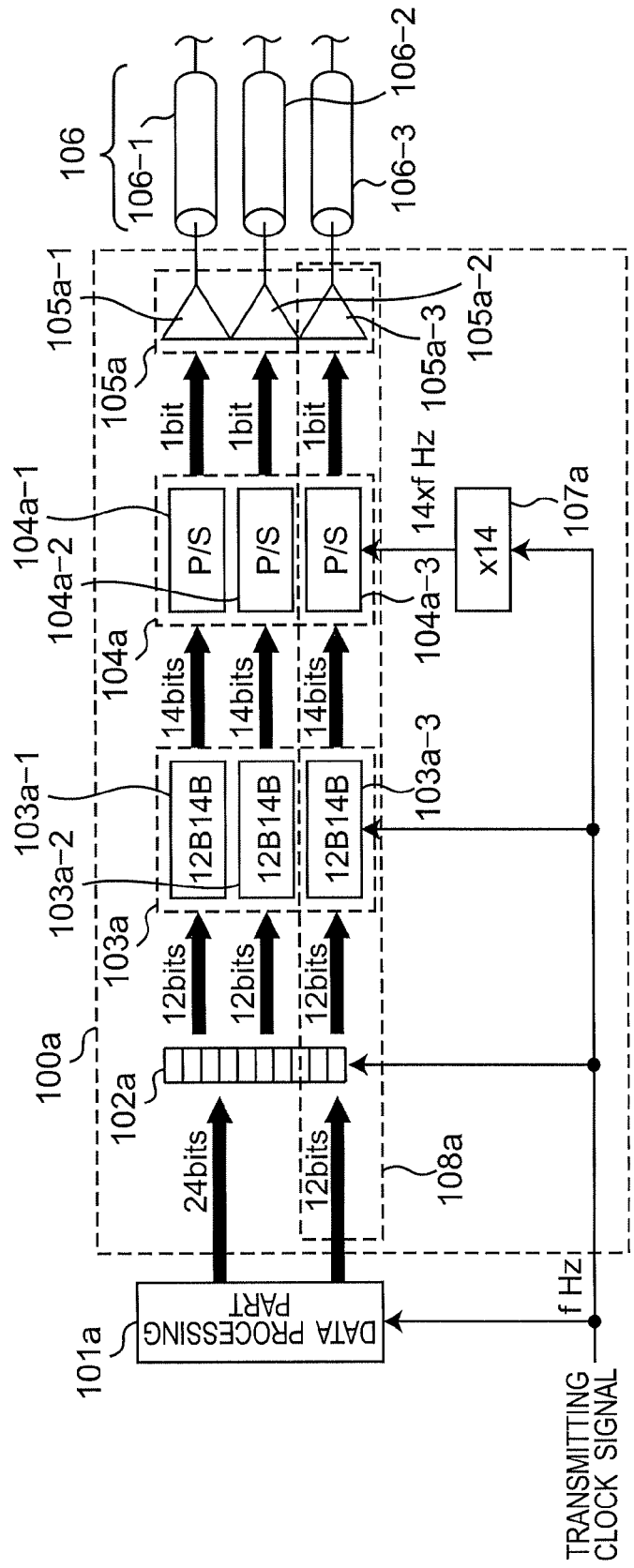
FIG. 1A is a block diagram showing a configuration of a transmitter apparatus 100a of a serial transmission system for performing 36-bit or 24-bit data transfer according to a first embodiment of the present disclosure.

Embodiments of the present disclosure will be described below with reference to the drawings. In the following embodiments, like components are denoted by like reference numerals, and no description is provided therefor.

First Embodiment

FIG. 1A is a block diagram showing a configuration of a transmitter apparatus 100a of a serial transmission system for performing 36-bit or 24-bit data transfer according to the first embodiment of the present disclosure. Referring to FIG. 1A, the transmitter apparatus 100a is configured to include a data processing part 101a, a buffer 102a for storing data, an encoder circuit 103a that is a parallel-to-parallel converter circuit, a parallel-to-serial converter circuit 104a, a driver circuit 105a, and a 14-fold multiplier circuit 107a. Further, the encoder circuit 103a is configured to include three 12B14B encoders 103a-1, 103a-2 and 103a-3, the parallel-to-serial converter circuit 104a is configured to include three parallel-to-serial converter circuit parts 104a-1, 104a-2 and 104a-3, and the driver circuit 105a is configured to include binary driver circuit parts 105a-1, 105a-2 and 105a-3.

Referring to FIG. 1A, the buffer 102a receives 36-bit or 24-bit parallel data outputted from the data processing part 101a by using a transmitting clock signal having a frequency f [Hz] from the data processing part 101a, temporarily stores the data, and thereafter outputs the data as data divided every 12 bits to the encoder circuit 103a. For example, the buffer 102a may be a storage apparatus, a storage region or the like, such as a semiconductor memory of SRAM, DRAM or the like. Next, the 12B14B encoders 103a-1, 103a-2 and 103a-3 each receive data divided every 12 bits from the buffer 102a, and thereafter, 12B14B-convert the 12-bit parallel data into 14-bit parallel data by using a transmitting clock signal having the frequency f [Hz], and outputs the resulting data to the parallel-to-serial converter circuit 104a. In this case, at the time of encoding, the encoding is performed so that data "0s" and data "1s" become equalized in number taking the DC balance into consideration. In detail, conversion from the 12-bit data to the 14-bit data with a DC balance guarantee is to extract and select 212 patterns whose "0s" and "1s" are equal in number among 214 patterns of "0s" and "1s". For example, "01001100011101" can be enumerated as the 14-bit pattern whose "0s" and "1s" are equalized in number.

The multiplier circuit 107a multiplies the transmitting clock signal having the frequency f [Hz] into a 14-fold high-speed clock signal having a frequency 14f [Hz], and outputs the resulting signal to the parallel-to-serial converter circuit parts 104a-1, 104a-2 and 104a-3. Moreover, the parallel-to-serial converter circuit parts 104a-1, 104a-2 and 104a-3 each parallel-to-serial convert the 14-bit parallel data with a DC balance guarantee from the 12B14B encoders 103a-1, 103a-2 and 103a-3, into 1-bit high-speed signals synchronized with the high-speed clock signal, and output the resulting signals to the binary driver circuit parts 105a-1, 105a-2 and 105a-3. Moreover, the binary driver circuit parts 105a-1, 105a-2 and 105a-3 each generate a binary transmission signal by amplifying the high-speed signal which has undergone the parallel-to-serial conversion, and transmit the resulting signals to the transmission path parts 106-1, 106-2 and 106-3 of a transmission path 106. Moreover, the binary transmission signals transmitted from the transmission path parts 106-1, 106-2 and 106-3 may be any signals that can be binarily distinguished, and the transmission may be performed, for example, on such conditions that H level=3 V and L level=0 V.

Figure 1B:
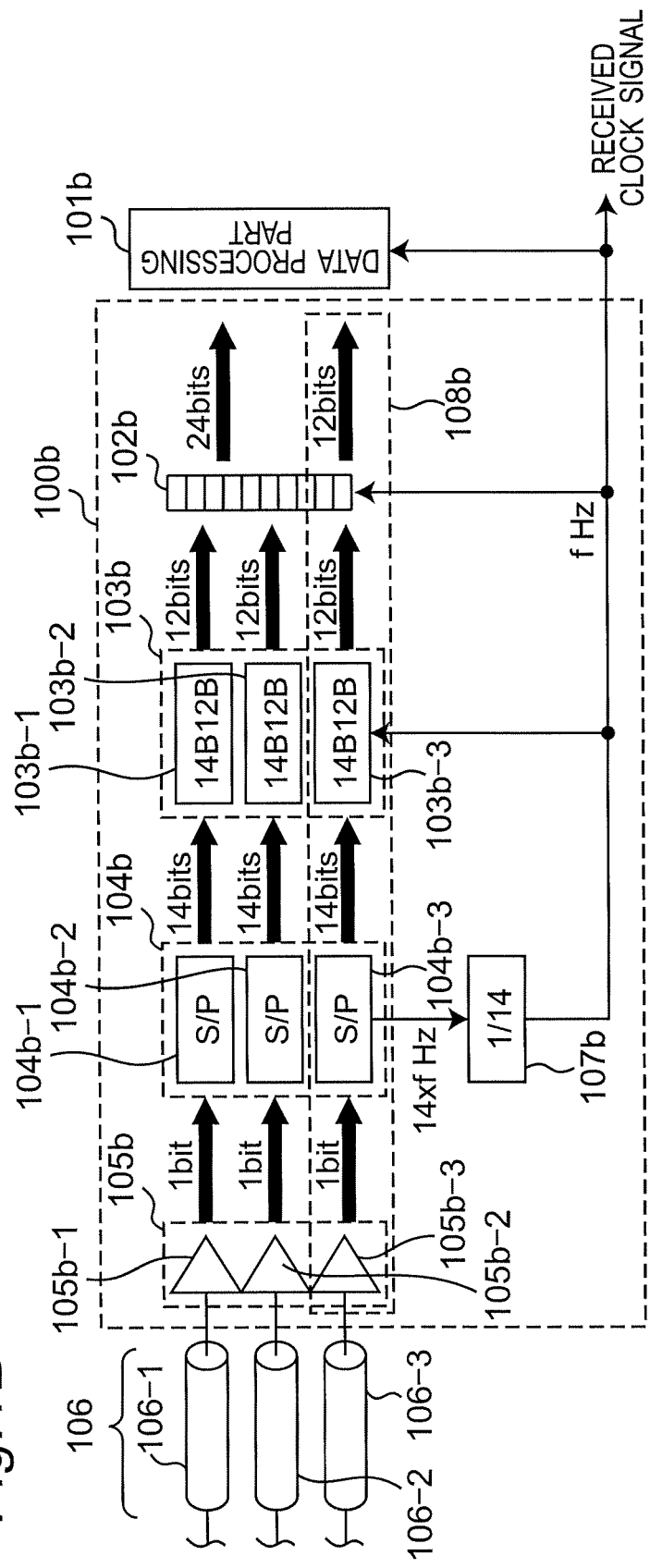
FIG. 1B is a block diagram showing a configuration of a receiver apparatus 100b of the serial transmission system for performing the 36-bit or 24-bit data transfer of the first embodiment of the present disclosure.

FIG. 1B is a block diagram showing a configuration of a receiver apparatus 100b of the serial transmission system for performing the 36-bit or 24-bit data transfer of the first embodiment of the present disclosure. Referring to FIG. 1B, the receiver apparatus 100b is configured to include a data processing part 101b, a buffer 102b for storing data, a decoder circuit 103b that is a parallel-to-parallel converter circuit, a serial-to-parallel converter circuit 104b, a receiver circuit 105b, and a ¹⁄₁₄-fold divider circuit 107b. Further, the decoder circuit 103b is configured to include three 14B12B decoders 103b-1, 103b-2 and 103b-3, the serial-to-parallel converter circuit 104b is configured to include three serial-to-parallel converter circuit parts 104b-1, 104b-2 and 104b-3, and the receiver circuit 105b is configured to include binary receiver circuit parts 105b-1, 105b-2 and 105b-3.

Referring to FIG. 1B, the binary receiver circuit parts 105b-1, 105b-2 and 105b-3 receive and amplify 1-bit binary transmission signals from the transmission path parts 106-1, 106-2 and 106-3, respectively, to generate 1-bit serial data, and thereafter, output the resulting data to the serial-to-parallel converter circuit parts 104b-1, 104b-2 and 104b-3. Next, the serial-to-parallel converter circuit parts 104b-1, 104b-2 and 104b-3 serial-to-parallel convert the 1-bit serial data from the receiver circuit parts 105b-1, 105b-2 and 105b-3 to into 14-bit parallel data, and output the resulting data to the 14B12B decoders 103b-1, 103b-2 and 103b-3. At the same time, the serial-to-parallel converter circuit parts 104b-1, 104b-2 and 104b-3 generate a high-speed clock signal for synchronization having the frequency 14f [Hz] from at least one 14-bit serial data of the serial-to-parallel converter circuit parts 104b-1, 104b-2 and 104b-3, and output the resulting signal.

The divider circuit 107b divides the high-speed clock signal regenerated by at least one of the serial-to-parallel converter circuit parts 104b-1, 104b-2 and 104b-3 into a ¹⁄₁₄-fold low-speed clock signal, and outputs the resulting signal as a received clock signal to the 14B12B decoders 103b-1, 103b-2 and 103b-3, the buffer 102b and the data processing part 101b. Next, the 14B12B decoders 103b-1, 103b-2 and 103b-3 each 14B12B-convert the 14-bit parallel data outputted from the serial-to-parallel converter circuit parts 104b-1, 104b-2 and 104b-3, into 12-bit parallel data by using the received clock signal having the frequency f [Hz], and output the resulting data to the buffer 102b. Further, the buffer 102b stores once the 12-bit parallel data by using the received clock signal, and thereafter, outputs 36-bit or 24-bit parallel data to the data processing part 101b. For example, the buffer 102b may be a storage apparatus, a storage region or the like, such as a semiconductor memory of SRAM, DRAM or the like.

The actions and effects of the serial transmission system including the transmitter apparatus 100a, the transmission path 106 and the receiver apparatus 100b as configured as above are described below.

First of all, the serial transmission system of the present embodiment is characterized in that selective changeover between the 36-bit parallel data transmission and the 24-bit parallel data transmission can be performed. Concretely, in transmitting the 36-bit parallel data, all the circuits of FIGS. 1A and 1B are operated. The 36-bit parallel data from the data processing part 101a is transmitted by division every 12 bits on the side of the transmitter apparatus 100a, while the parallel data transmitted by division every 12 bits is received, thereafter converted into 36-bit parallel data, and thereafter outputted to the data processing part 101b on the side of the receiver apparatus 100b.

In contrast to this, upon transmitting the 24-bit parallel data, in the circuit of FIG. 1A, (1) a storage region of 12 bits among 36 bits of the buffer 102a is set to an unused region, (2) the operation of the 12B14B encoder 103a-3 is set to a rest state, (3) the operation of the parallel-to-serial converter circuit part 104a-3 is set to a rest state, and (4) the operation of the binary driver circuit part 105a-3 is set to a rest state.

Moreover, in the circuit of FIG. 1B, (5) the operation of the binary receiver circuit part 105b-3 is set to a rest state, (6) the operation of the serial-to-parallel converter circuit part 104b-3 is set to a rest state, (7) the operation of the 14B12B decoder 103b-3 is set to a rest state, and (8) the storage region of 12 bits among 36 bits of the buffer 102b is set to the unused region.

Then, in the transmitter apparatus 100a and the receiver apparatus 100b, only the 24-bit parallel data is processed and transmitted. That is, by thus resting the transmitter circuit 108a of the 12-bit channel and the receiver circuit 108b of the 12-bit channel, and operating the transmitter circuit of the remaining 24-bit channel and the receiver circuit of the 24-bit channel, transmission of 24-bit parallel data is achieved.

Moreover, the encoder circuit 103a includes three 12B14B encoders 103b-1, 103b-2 and 103b-3 to convert 12-bit parallel data into 14-bit parallel data in the transmitter apparatus 100a of the present embodiment, while the decoder circuit 103b includes three 14B12B encoders 103a-1, 103a-2 and 103a-3 to convert 14-bit parallel data into 12-bit parallel data in the receiver apparatus 100b. Therefore, 12-bit data processing can be efficiently executed. In particular, changeover between 36 bits and 24 bits can be performed as described above, and therefore, these data, which are multiples of 12 bits, have affinities with the 12-bit data processing.

According to the serial transmission system of the above embodiment, the 36-bit data processing and data transfer can be achieved with a simple circuit configuration by using the transmission path parts 106-1 to 106-3 of three channels. Upon transmitting the 36-bit data, a data efficiency of 85.7% per channel in terms of binary transmission can be achieved, which is higher than 80% when the prior art 8B10B transmission system (transmission frequency is 10f [Hz], and the number of transmission channels is three) is used, and a total data efficiency of 85.7% can be achieved, which is higher than 80% when the 8B10B transmission system (transmission frequency is 10f [Hz], and the number of transmission channels is three) is used.

Further, according to the serial transmission system of the present embodiment, the 24-bit data processing and data transfer can be achieved with a simple circuit configuration by operating only the aforementioned circuit of the 24-bit channel, and using only the transmission path parts 106-1 and 106-2 of two channels. Upon transmitting the 24-bit data, a data efficiency of 85.7% per channel in terms of binary transmission can be achieved, which is higher than 80% when the prior art 8B10B transmission system (transmission frequency is 10f [Hz], and the number of transmission channels is three) is used, and a total data efficiency of 85.7% can be achieved, which is higher than 80% when the 8B10B transmission system (transmission frequency is 10f [Hz], and the number of transmission channels is three) is used.

As described above, according to the present embodiment, the baseband signal of the transmission signal is generated by using the 12B14B encoders 103a-1 to 103a-3 that generate the 14-bit parallel data with the DC balance secured, and therefore, serial data transmission capable of more reliably performing the clock regeneration and data synchronization becomes possible. Further, changeover between the 36-bit data transfer and the 24-bit data transfer can be also performed.

Second Embodiment

Figure 2A:
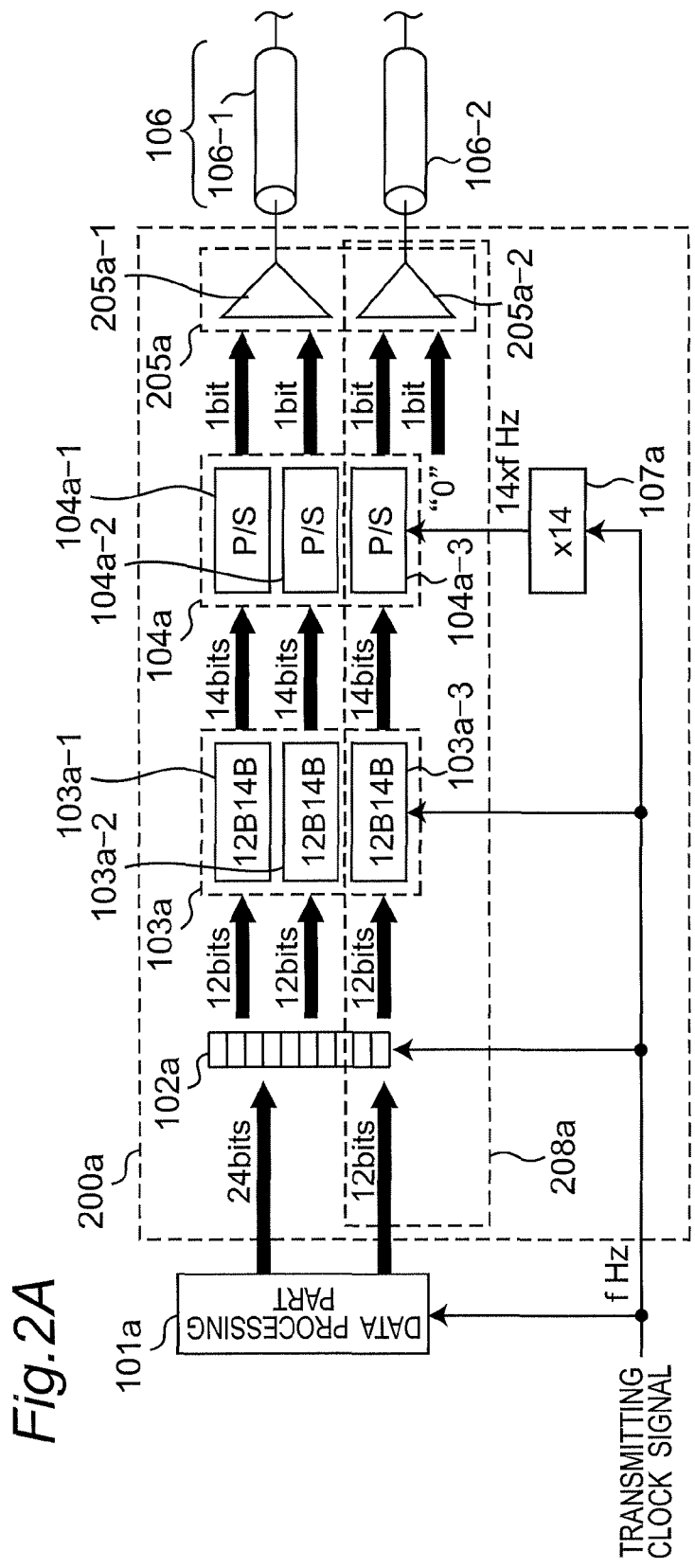
FIG. 2A is a block diagram showing a configuration of a transmitter apparatus 200a of a serial transmission system for performing 36-bit or 24-bit data transfer according to a second embodiment of the present disclosure.

FIG. 2A is a block diagram showing a configuration of a transmitter apparatus 200a of a serial transmission system for performing 36-bit or 24-bit data transfer according to the second embodiment of the present disclosure. The transmitter apparatus 200a is characterized in that a driver circuit 205a having two quadri-valued driver circuit parts 205a-1 and 205a-2 is provided in place of the driver circuit 105a, as compared with the transmitter apparatus 100a of FIG. 1A.

Referring to FIG. 2A, the quadri-valued driver circuit parts 205a-1 and 205a-2 each generate a quadri-valued transmission signal by amplifying the parallel-to-serial converted high-speed signal, and output the resulting signals to the transmission path parts 106-1 and 106-2. In this case, the quadri-valued driver circuit part 205a-1 amplifies each of 1-bit high-speed signals from the parallel-to-serial converter circuit parts 104a-1 and 104a-2, and transmits the resulting signal. On the other hand, the quadri-valued driver circuit part 205a-2 amplifies only a 1-bit high-speed signal from the parallel-to-serial converter circuit part 104a-3, and transmits the resulting signal. In detail, the quadri-valued driver circuit part 205a-2 generates a binary signal from the 1-bit high-speed signal from the parallel-to-serial converter circuit part 104a-3 and a consecutive signal of "01" as a dummy signal, and transmits the resulting signal as a quadri-valued transmission signal to the transmission path 106-2. Moreover, the quadri-valued transmission signal transmitted from each of the transmission path parts 106-1 and 106-2 is allowed to be any signal of which the four values can be distinguished, and transmitted, for example, on such conditions that H level=3 V, HM level=2 V, ML=1 V, and L level=0 V.

Figure 2B:
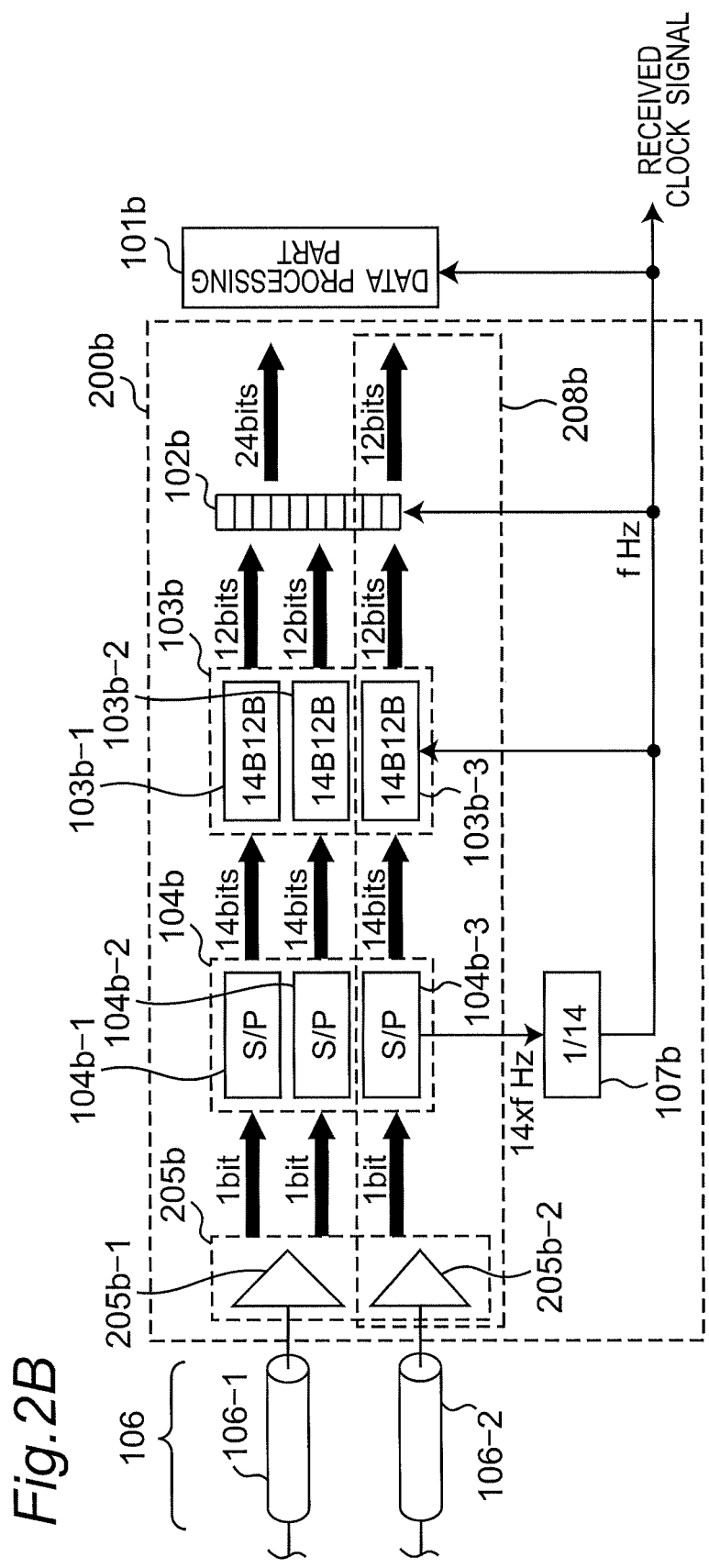
FIG. 2B is a block diagram showing a configuration of a receiver apparatus 200b of the serial transmission system for performing the 36-bit or 24-bit data transfer of the second embodiment of the present disclosure.

FIG. 2B is a block diagram showing a configuration of a receiver apparatus 200b of the serial transmission system for performing the 36-bit or 24-bit data transfer of the second embodiment of the present disclosure. The receiver apparatus 200b of FIG. 2B is characterized in that a receiver circuit 205b having two quadri-valued receiver circuit parts 205b-1 and 205b-2 is provided in place of the receiver circuit 105b, as compared with the receiver apparatus 100b of FIG. 1B.

Referring to FIG. 2B, the quadri-valued receiver circuit part 205b-1 receives and amplifies the quadri-valued transmission signal from the transmission path part 106-1 to generate two 1-bit serial data, and thereafter, outputs the 1-bit serial data to each of the serial-to-parallel converter circuit parts 104b-1 and 104b-2. Moreover, the quadri-valued receiver circuit part 205b-2 receives and amplifies the quadri-valued transmission signal from the transmission path part 106-2 to generate one 1-bit serial data for which the dummy signal is considered, and thereafter, outputs the resulting data to the serial-to-parallel converter circuit part 104b-3.

The actions and effects of the serial transmission system having the transmitter apparatus 200a, the transmission path 106 and the receiver apparatus 200b as configured as above are described below.

First of all, the serial transmission system of the present embodiment is characterized in that selective changeover between the 36-bit parallel data transmission and the 24-bit parallel data transmission can be performed. Concretely, upon transmitting the 36-bit parallel data, all the circuits of FIGS. 2A and 2B are operated. The 36-bit parallel data from the data processing part 101a is transmitted by division every 12 bits on the side of the transmitter apparatus 200a, while the parallel data transmitted by division every 12 bits is received, thereafter converted into 36-bit parallel data, and thereafter outputted to the data processing part 101b on the side of the receiver apparatus 200b.

In contrast to this, upon transmitting the 24-bit parallel data, in the circuit of FIG. 2A,
(1) a storage region of 12 bits among 36 bits of the buffer 102a is set to an unused region,
(2) the operation of the 12B14B encoder 103a-3 is set to a rest state,
(3) the operation of the parallel-to-serial converter circuit part 104a-3 is set to a rest state, and
(4) the operation of the quadri-valued driver circuit part 205a-2 is set to a rest state.

Moreover, in the circuit of FIG. 2B,
(5) the operation of the quadri-valued receiver circuit part 205b-2 is set to a rest state,
(6) the operation of the serial-to-parallel converter circuit part 104b-3 is set to a rest state,
(7) the operation of the 14B12B decoder 103b-3 is set to a rest state, and
(8) the storage region of 12 bits among 36 bits of the buffer 102b is set to the unused region.

Then, in the transmitter apparatus 200a and the receiver apparatus 200b, only the 24-bit parallel data is processed and transmitted. That is, by thus resting the transmitter circuit 208a of the 12-bit channel and the receiver circuit 208b of the 12-bit channel, and operating the transmitter circuit of the remaining 24-bit channel and the receiver circuit of the 24-bit channel, transmission of 24-bit parallel data is achieved.

Moreover, the encoder circuit 103a includes three 12B14B encoders 103a-1, 103a-2 and 103a-3 to convert 12-bit parallel data into 14-bit parallel data in the transmitter apparatus 200a of the present embodiment, while the decoder circuit 103b includes three 14B12B encoders 103b-1, 103b-2 and 103b-3 to convert 14-bit parallel data into 12-bit parallel data in the receiver apparatus 200b. Therefore, 12-bit data processing can be efficiently executed. In particular, changeover between 36 bits and 24 bits can be performed as described above, and therefore, these data, which are multiples of 12 bits have affinities with the 12-bit data processing.

According to the serial transmission system of the above embodiment, the 36-bit data processing and data transfer can be achieved with a simple circuit configuration by using the transmission path parts 106-1 and 106-2 of two channels. Upon transmitting the 36-bit data, a data efficiency of 171.4% per channel in terms of binary transmission can be achieved, which is higher than 80% when the prior art 8B10B transmission system (transmission frequency is 10f [Hz], and the number of transmission channels is three) is used, and a total data efficiency of 128.6% can be achieved, which is higher than 80% when the prior art 8B10B transmission system (transmission frequency is 10f [Hz], and the number of transmission channels is three) is used.

Further, according to the serial transmission system of the present embodiment, the 24-bit data processing and data transfer can be achieved with a simple circuit configuration by operating only the aforementioned circuit of the 24-bit channel, and using only the transmission path parts 106-1 and 106-2 of two channels. Upon transmitting the 24-bit data, a data efficiency of 171.4% per channel in terms of binary transmission can be achieved, which is higher than 80% when the prior art 8B10B transmission system (transmission frequency is 10f [Hz], and the number of transmission channels is three) is used, and a total data efficiency of 171.4% can be achieved, which is higher than 80% when the prior art 8B10B transmission system (transmission frequency is 10f [Hz], and the number of transmission channels is three) is used.

As described above, according to the present embodiment, the baseband signal of the transmission signal is generated by using the 12B14B encoders 103a-1 to 103a-3 that generate the 14-bit parallel data with the DC balance secured, and therefore, serial data transmission capable of more reliably performing the clock regeneration and data synchronization becomes possible. Further, changeover between the 36-bit data transfer and the 24-bit data transfer can be also performed.

Third Embodiment

Figure 3A:
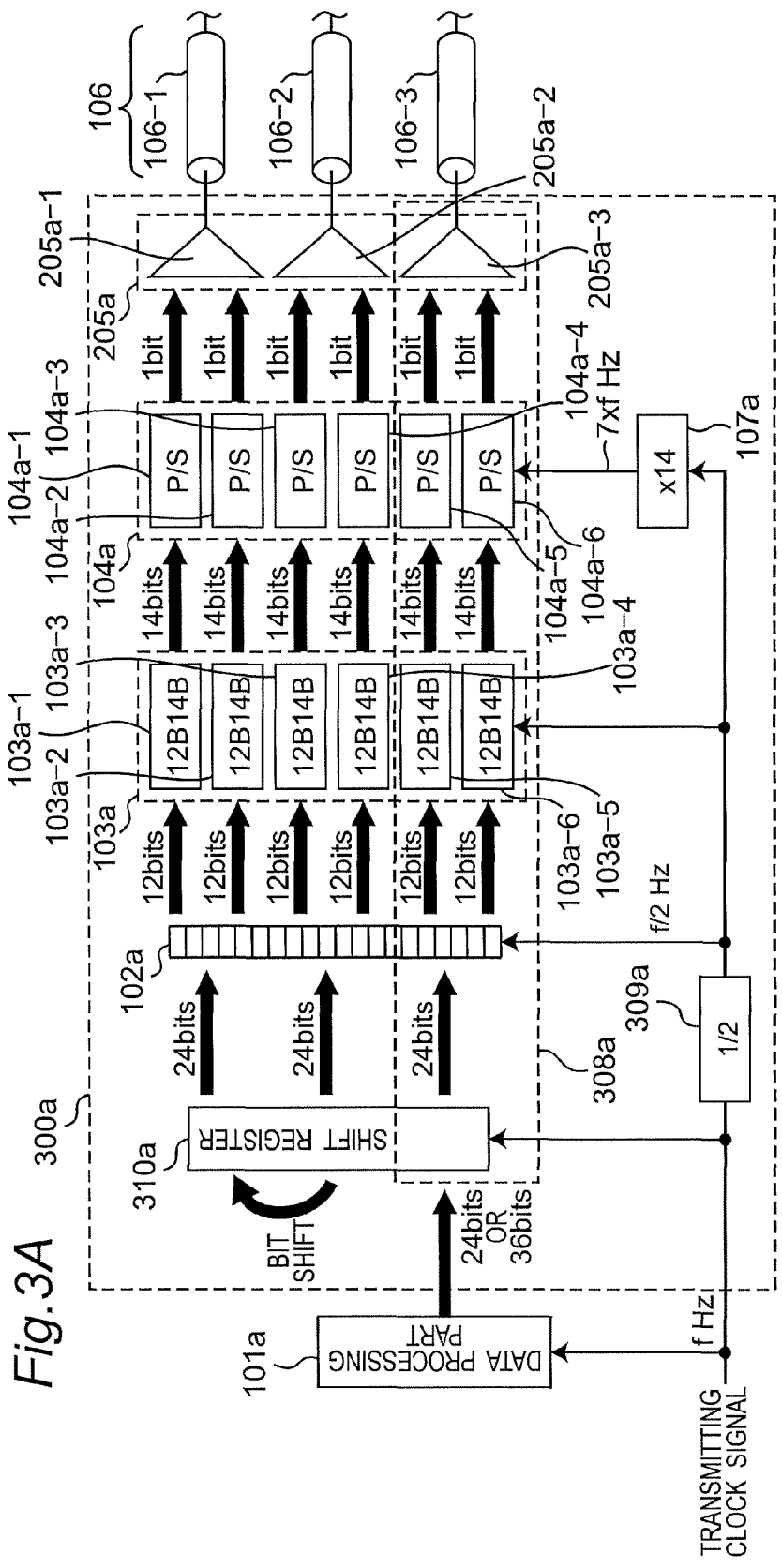
FIG. 3A is a block diagram showing a configuration of a transmitter apparatus 300a of a serial transmission system for performing 36-bit or 24-bit data transfer according to a third embodiment of the present disclosure.

FIG. 3A is a block diagram showing a configuration of a transmitter apparatus 300a of a serial transmission system for performing 36-bit or 24-bit data transfer according to the third embodiment of the present disclosure. The transmitter apparatus 300a of FIG. 3A is characterized in that a shift register 310a having a storage region of 72 bits is provided in the preceding stage of the buffer 102a, 12B14B encoders 103a-5 and 103a-6 are further provided, parallel-to-serial converter circuit parts 104a-5 and 104a-6 are further provided, and a quadri-valued driver circuit part 205a-3 is further provided, as compared with the transmitter apparatus 200a of FIG. 2A.

In this case, the shift register 310a is provided to parallel-to-serial convert 24-bit or 36-bit parallel data outputted from the data processing part 101a into 48-bit or 72-bit parallel data by the circuits in the succeeding stages of the shift register 310a. It is noted that the operations of the 12B14B encoders 103a-5 and 103a-6 are similar to the operations of the aforementioned 12B14B encoders 103a-1, 103a-2, 103a-3 and 103a-4, and the operations of the parallel-to-serial converter circuit parts 104a-5 and 104a-6 are similar to the operations of the aforementioned parallel-to-serial converter circuit parts 104a-1, 104a-2, 104a-3 and 104a-4. Further, the operation of the quadri-valued driver circuit part 205a-3 is similar to the operations of the quadri-valued driver circuit parts 205a-1 and 205a-2, and a quadri-valued transmission signal from the quadri-valued driver circuit part 205a-3 is transmitted to the side of the receiver apparatus 300b via the transmission path part 106-3.

Referring to FIG. 3A, the shift register 310a stores data outputted from the data processing part 101a by using the transmitting clock signal having the frequency f [Hz], performs a 36-bit or 24-bit shift, and thereafter outputs the resulting data to the buffer 102a.

Figure 3B:
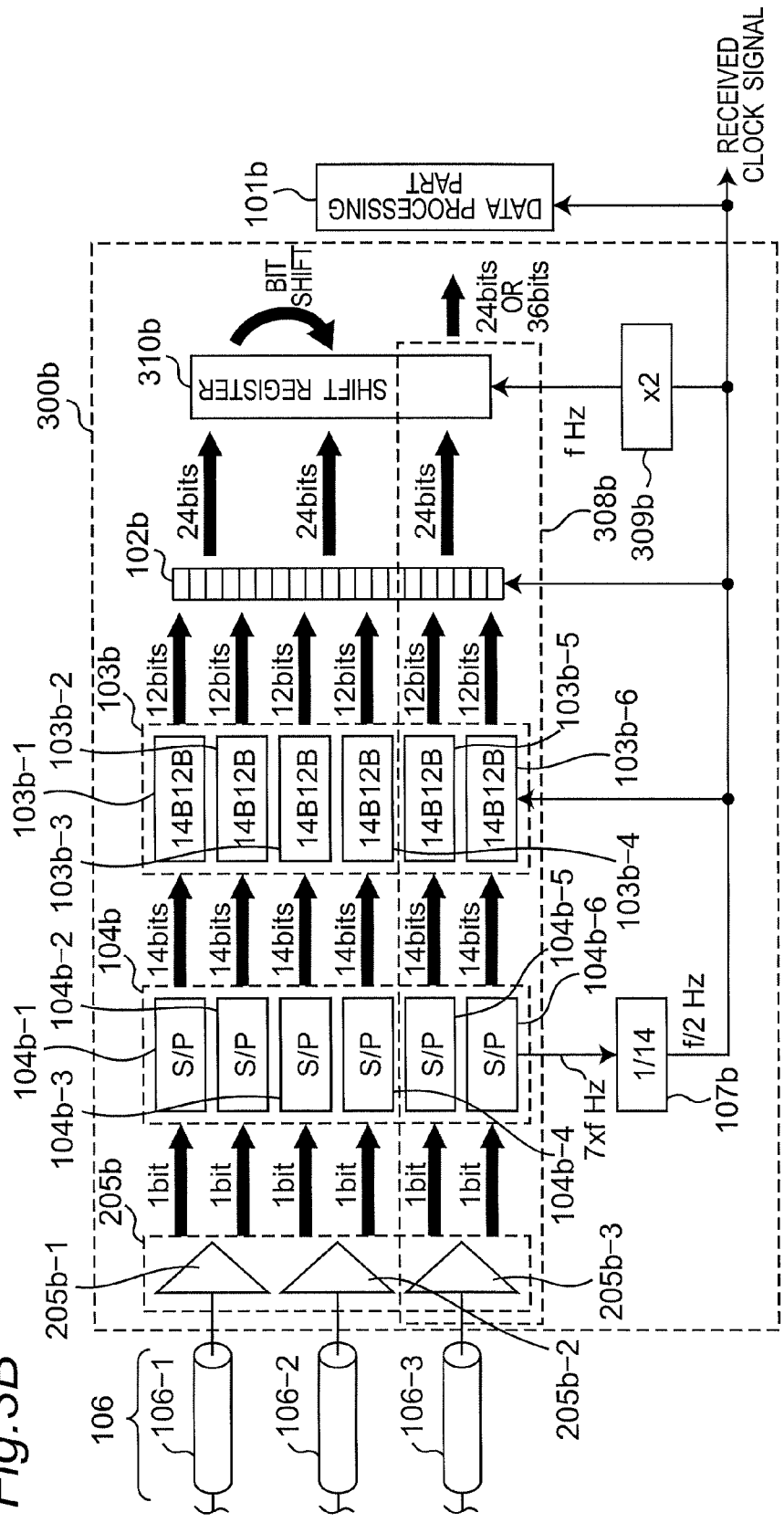
FIG. 3B is a block diagram showing a configuration of a receiver apparatus 300b of the serial transmission system for performing the 36-bit or 24-bit data transfer of the third embodiment of the present disclosure.
Figure 3C:
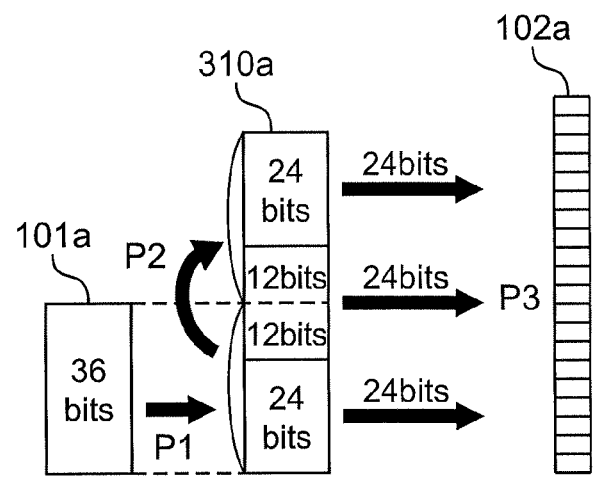
FIG. 3C is a block diagram for explaining a 36-bit shift in the shift register 310a of FIG. 3A.

FIG. 3C is a block diagram for explaining the 36-bit shift in the aforementioned shift register 310a of FIG. 3A. Referring to FIG. 3C, when 36-bit parallel data is inputted from the data processing part 101a, the parallel data is stored once into the storage region of 36 bits in the lower half of the shift register 310a having a storage region of 72 bits (P1). Next, the parallel data stored in the storage region in the lower half of the shift register 310a are subjected to a bit shift and stored into the storage region of 36 bits in the upper half of the shift register 310a (P2). Next, all the parallel data of 72 bits stored in the shift register 310a are outputted to the buffer 102a (P3), and stored once into the buffer 102a. The transfer of the parallel data is thus performed in units of 36 bits.

Figure 3D:
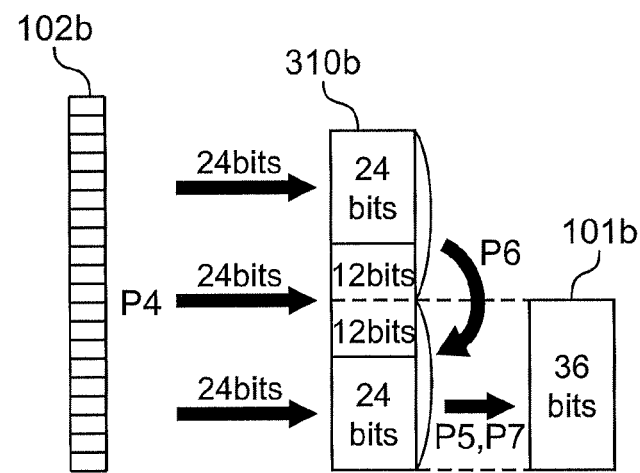
FIG. 3D is a block diagram for explaining a 36-bit shift in the shift register 310b of FIG. 3B.
Figure 3E:
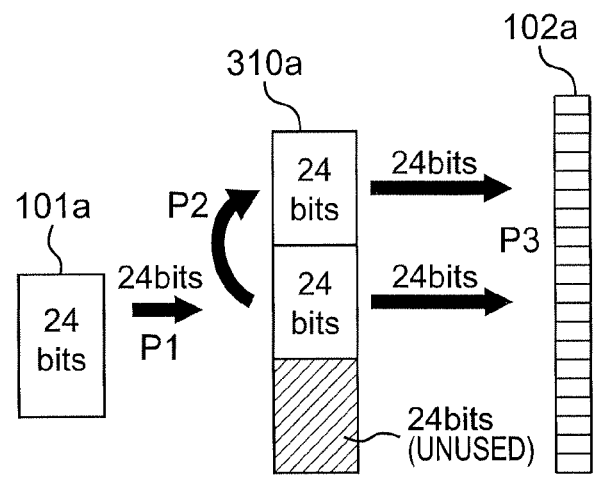
FIG. 3E is a block diagram for explaining a 24-bit shift in the shift register 310a of FIG. 3A.

FIG. 3E is a block diagram for explaining the 24-bit shift in the aforementioned shift register 310a of FIG. 3A. Referring to FIG. 3E, when 24-bit parallel data is inputted from the data processing part 101a, the parallel data is stored once into the storage region of 24 bits in the center portion of the shift register 310a having a storage region of 72 bits (P1). In this case, the storage region of 24 bits in the lowermost portion of the shift register 310a is set to an unused region. Next, the parallel data of 24 bits stored in the center portion is subjected to a bit shift into the storage region of 24 bits in the uppermost portion of the shift register 310a (P2). Next, all the data of 48 bits in the shift register 310a are outputted to the buffer 102a (P3) and stored once into the buffer 102a.

Referring to FIG. 3A, the divider circuit 309a divides the transmitting clock signal having the frequency f [Hz] into a half low-speed clock signal having a frequency f/2 [Hz], and outputs the resulting signal to the buffer 102a, the 12B14B decoders 103b-1, 103b-2, 103b-3, 103b-4, 103b-5 and 103b-6 and the 14-fold multiplier circuit 107a.

FIG. 3B is a block diagram showing a configuration of a receiver apparatus 300b of the serial transmission system for performing the 36-bit or 24-bit data transfer of the third embodiment of the present disclosure. The receiver apparatus 300b of FIG. 3B is characterized in that a shift register 310b having a storage region of 72 bits in the succeeding stage of the buffer 102b is further provided, 14B12B decoders 103b-5 and 103b-6 are further provided, serial-to-parallel converter circuit parts 104b-5 and 104b-6 are further provided, and a quadri-valued receiver circuit part 205b-3 is further provided, as compared with the receiver apparatus 200b of FIG. 2B.

In this case, the shift register 310b is provided to output the parallel data of a total of 48 bits or a total of 72 bits inputted from the 14B12B decoders 103b-1, 103b-2, 103b-3, 103b-4, 103b-5 and 103b-6 as 24-bit or 36-bit parallel data to the data processing part 101b. It is noted that the operations of the 14B12B decoders 103*b*-5 and 103*b*-6 are similar to the operations of the aforementioned 14B12B decoders 103*b*-1, 103*b*-2, 103*b*-3 and 103*b*-4, and the operations of the serial-to-parallel converter circuit parts 104*b*-5 and 104*b*-6 are similar to the operations of the aforementioned serial-to-parallel converter circuit parts 104*b*-1, 104*b*-2, 104*b*-3 and 104*b*-4. Further, the operation of the quadri-valued receiver circuit part 205*b*-3 is similar to the operations of the quadri-valued receiver circuit parts 205*b*-1 and 205*b*-2, and the quadri-valued receiver circuit part 205*b*-3 receives the quadri-valued transmission signal from the transmission path part 106-3.

Referring to FIG. 3B, the multiplier circuit 309*b* multiplies 2-fold the received clock signal having the frequency f/2 [Hz] from the divider circuit 107*b* into a double-speed clock signal having the frequency f [Hz], and outputs the resulting signal to the shift register 310*b*. Moreover, referring to FIG. 3B, the shift register 310*b* stores the data inputted from the buffer 102*b* by using the double-speed clock signal, performs a 24-bit or 36-bit shift, and outputs the resulting data to the data processing part 101*b*.

FIG. 3D is a block diagram for explaining the 36-bit shift in the aforementioned shift register 310*b* of FIG. 3B. Referring to FIG. 3D, two units of parallel data, whose one unit is 36-bit parallel data, are outputted from the buffer 102*b* and stored once into the shift register 310*b* having the storage region of 72 bits (P4). Next, the 36-bit parallel data stored in the storage region in the lower half of the shift register 310*b* is outputted to the data processing part 101*b* (P5). Next, the 36-bit parallel data stored in the storage region in the upper half is subjected to a bit shift into the storage region of 36 bits in the lower half of the shift register 310*b* (P6). Next, the 36-bit parallel data stored in the storage region in the lower half of the shift register 310*b* is outputted to the data processing part 101*b* (P7). The transfer of the parallel data is thus performed in units of 36 bits.

Figure 3F:
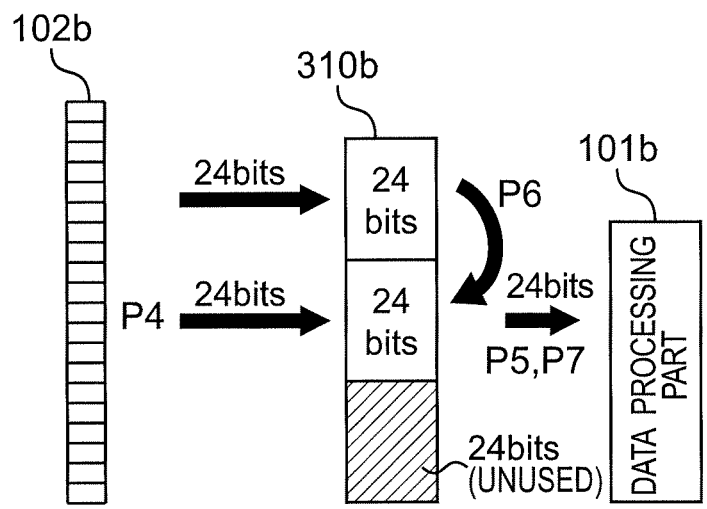
FIG. 3F is a block diagram for explaining a 24-bit shift in the shift register 310b of FIG. 3B.

FIG. 3F is a block diagram for explaining the 24-bit shift in the aforementioned shift register 310*b* of FIG. 3B. Referring to FIG. 3F, the 48-bit data of two units stored once in the buffer 102*b* is stored once into the shift register 310*b* having the storage region of 72 bits (P4). In this case, the storage region of 24 bits in the lowermost portion of the shift register 310*b* is set to an unused region. Next, the 24-bit parallel data stored in the storage region in the center portion of the shift register 310*b* is outputted to the data processing part 101*b* (P5). Next, the 24-bit parallel data stored in the storage region in the uppermost portion is subjected to a bit shift into the storage region of 24 bits in the center portion of the shift register 310*b* (P6). Next, the 24-bit data stored in the storage region in the center portion of the shift register 310*b* is outputted to the data processing part 101*b* (P7). The transfer of the parallel data is thus performed in units of 24 bits.

The actions and effects of the serial transmission system including the transmitter apparatus 300*a*, the transmission path 106 and the receiver apparatus 300*b* as configured as above are described below.

First of all, the serial transmission system of the present embodiment is characterized in that selective changeover between the 36-bit parallel data transmission and the 24-bit parallel data transmission can be performed. Concretely, upon transmitting the 36-bit parallel data, all the circuits of FIGS. 3A and 3B are operated. The 72-bit parallel data of two units from the data processing part 101*a* is transmitted by division every 12 bits on the side of the transmitter apparatus 300*a*, while the parallel data transmitted by division every 12 bits is received, thereafter converted into 72-bit parallel data of two units, and thereafter outputted to the data processing part 101*b* on the side of the receiver apparatus 300*b*.

In contrast to this, upon transmitting the 24-bit parallel data, in the circuit of FIG. 3A,
(1) a storage region of 24 bits among 72 bits of the shift register 310*a* is set to an unused region,
(2) a storage region of 24 bits among 72 bits of the buffer 102*a* is set to an unused region,
(3) the operations of the 12B14B encoders 103*a*-5 and 103*a*-6 are set to a rest state,
(4) the operations of the parallel-to-serial converter circuit parts 104*a*-5 and 104*a*-6 are set to a rest state, and
(5) the operation of the quadri-valued driver circuit part 205*a*-3 is set to a rest state.

Moreover, in the circuit of FIG. 3B,
(6) the operation of the 4-value receiver circuit part 205*b*-3 is set to a rest state,
(7) the operations of the serial-to-parallel converter circuit parts 104*b*-5 and 104*b*-6 are set to a rest state,
(8) the operations of the 14B12B decoders 103*b*-5 and 103*b*-6 are set to a rest state,
(9) the storage region of 24 bits among 72 bits of the buffer 102*b* is set to the unused region, and
(10) the storage region of 24 bits among 72 bits of the shift register 310*b* is set to the unused region.

Then, in the transmitter apparatus 300*a* and the receiver apparatus 300*b*, only two units of parallel data, whose one unit is 24-bit parallel data, are processed and transmitted. That is, by thus resting the transmitter circuit 308*a* of the 24-bit channel and the receiver circuit 308*b* of the 24-bit channel, and operating the transmitter circuit of the remaining 48-bit channel and the receiver circuit of the 48-bit channel, transmission of 48-bit parallel data of two units is achieved.

Moreover, the encoder circuit 103*a* includes six 12B14B encoders 103*a*-1, 103*a*-2, 103*a*-3, 103*a*-4, 103*a*-5 and 103*a*-6 to convert 12-bit parallel data into 14-bit parallel data in the transmitter apparatus 300*a* of the present embodiment, while the decoder circuit 103*b* includes six 14B12B encoders 103*b*-1, 103*b*-2, 103*b*-3, 103*b*-4, 103*b*-5, 103*b*-6 to convert 14-bit parallel data into 12-bit parallel data in the receiver apparatus 300*b*. Therefore, 12-bit data processing can be efficiently executed. In particular, changeover between 36 bits and 24 bits can be performed as described above, and therefore, these data, which are multiples of 12 bits, have affinities with the 12-bit data processing.

According to the serial transmission system of the above embodiment, the 36-bit data processing and data transfer of the two units can be achieved with a simple circuit configuration by using the transmission path parts 106-1, 106-2 and 106-3 of three channels. Upon transmitting the 36-bit data, a data efficiency of 171.4% per channel in terms of binary transmission can be achieved, which is higher than 80% when the prior art 8B10B transmission system (transmission frequency is 10f [Hz], and the number of transmission channels is three) is used, and a total data efficiency of 171.4% can be achieved, which is higher than 80% when the prior art 8B10B transmission system (transmission frequency is 10f [Hz], and the number of transmission channels is three) is used.

Further, according to the serial transmission system of the present embodiment, the 24-bit data processing and data transfer of two units can be achieved with a simple circuit configuration by operating only the circuit of the 48-bit channel and using only the transmission path parts 106-1 and 106-2 of two channels. Upon transmitting the 24-bit data, a data efficiency of 171.4% per channel in terms of binary transmission can be achieved, which is higher than 80% when the prior art 8B10B transmission system (transmission frequency is 10f [Hz], and the number of transmission channels is three) is used, and a total data efficiency of 171.4% can be achieved, which is higher than 80% when the prior art 8B10B transmission system (transmission frequency is 10f [Hz], and the number of transmission channels is three) is used.

As described above, according to the present embodiment, the baseband signal of the transmission signal is generated by using the 12B14B encoders 103*a*-1 to 103*a*-6 that generate the 14-bit parallel data with the DC balance secured, and therefore, serial data transmission capable of more reliably performing the clock regeneration and data synchronization becomes possible. Further, changeover between the 36-bit data transfer and the 24-bit data transfer can be also performed. Furthermore, according to the present embodiment, the serial transmission with the transmission speed suppressed to a half becomes possible with the data efficiency maintained, as compared with the configuration of the first embodiment.

Fourth Embodiment

FIG. 4A is a block diagram showing a configuration of a transmitter apparatus 400*a* of a serial transmission system for performing 36-bit data transfer according to the fourth embodiment of the present disclosure. The transmitter apparatus 400*a* shown in FIG. 4A has a configuration similar to that of the transmitter apparatus 300*a* of the serial transmission system of FIG. 3A for performing 36-bit data transfer, and operates likewise.

Figure 4B:
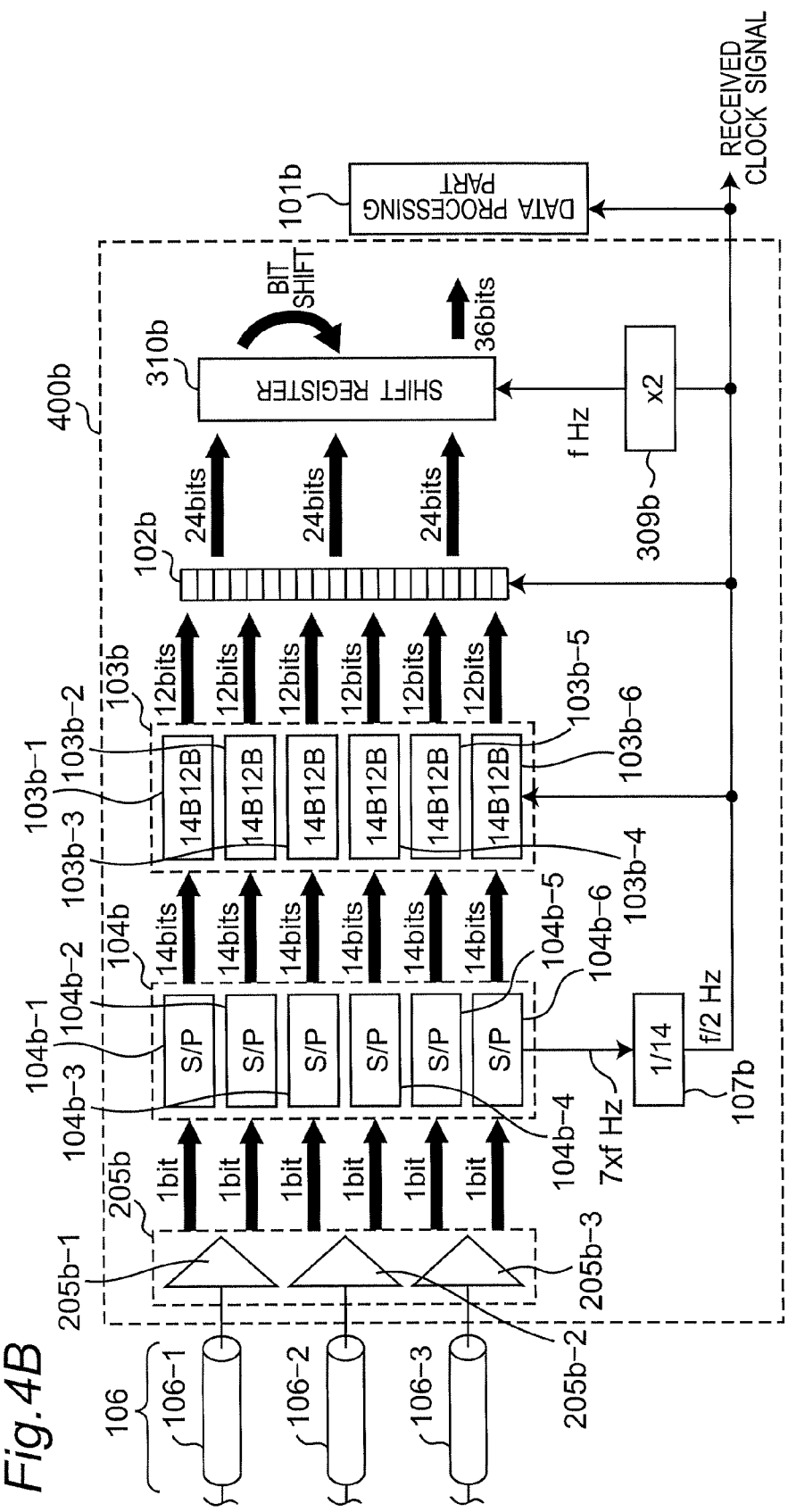
FIG. 4B is a block diagram showing a configuration of a receiver apparatus 400b of the serial transmission system for performing the 36-bit data transfer of the fourth embodiment of the present disclosure.

FIG. 4B is a block diagram showing a configuration of a receiver apparatus 400*b* of the serial transmission system for performing the 36-bit data transfer of the fourth embodiment of the present disclosure. The receiver apparatus 400*b* shown in FIG. 4B has a configuration similar to that of the receiver apparatus 300*b* of the serial transmission system of FIG. 3B for performing 36-bit data transfer, and operates likewise.

Figure 4C:
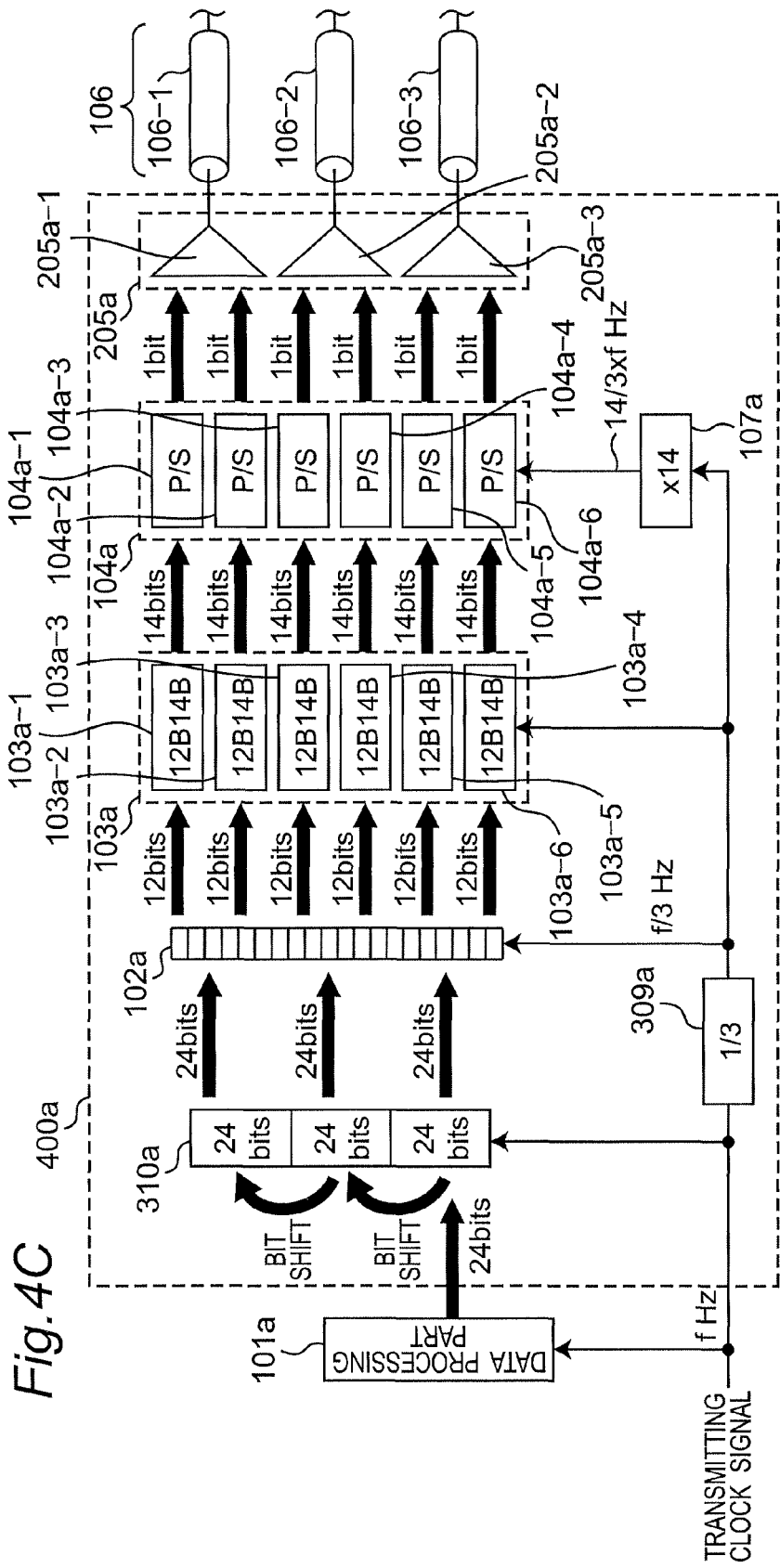
FIG. 4C is a block diagram showing a configuration of a transmitter apparatus 400a of a serial transmission system for performing 24-bit data transfer according to a modified embodiment of the fourth embodiment of the present disclosure.

FIG. 4C is a block diagram showing a configuration of a transmitter apparatus 400*a* of a serial transmission system for performing 24-bit data transfer according to a modified embodiment of the fourth embodiment of the present disclosure. The transmitter apparatus 400*a* shown in FIG. 4C is characterized in that a ⅓-fold divider circuit 309*a* is provided in place of the ½-fold divider circuit 309*a*, as compared with the transmitter apparatus 300*a* shown in FIG. 3A, and all the circuits are operated to perform 24-bit data transfer instead of resting the transmitter circuit 308*a* of the 24-bit channel shown in FIG. 3A.

Referring to FIG. 4C, the shift register 310*a* stores parallel data outputted from the data processing part 101*a* by using the transmitting clock signal having the frequency f [Hz], subsequently performs a 24-bit shift twice, and outputs the resulting data to the buffer 102*a*.

Referring to FIG. 4C, when 24-bit parallel data is inputted from the data processing part 101*a*, the data is stored once into a storage region of 24 bits in the lowermost portion of the shift register 310*a* having a storage region of 72 bits. Next, the 24-bit parallel data in the lowermost portion of the shift register 310*a* is subjected to a bit shift into a storage region of 24 bits in the center portion of the shift register 310*a*. Next, the 24-bit parallel data is inputted from the data processing part 101*a*, and the 24-bit parallel data is stored into a storage region of 24 bits in the lowermost portion of the shift register 310*a*. Next, the 24-bit parallel data stored in the storage region in the center portion of the shift register 310*a* is subjected to a bit shift into a storage region of 24 bits in the uppermost portion of the shift register 310*a*. Next, the 24-bit parallel data stored in the storage region in the lowermost portion of the shift register 310*a* is subjected to a bit shift into the storage region of 24 bits in the center portion of the shift register 310*a*. Next, the 24-bit parallel data is outputted from the data processing part 101*a*, and stored once into the storage region of 24 bits in the lowermost portion of the shift register 310*a*. Finally, the parallel data of a total of 72 bits in the shift register 310*a* is inputted to the buffer 102*a* and stored once. The transfer of the parallel data is thus performed in units of 24 bits.

Figure 4D:
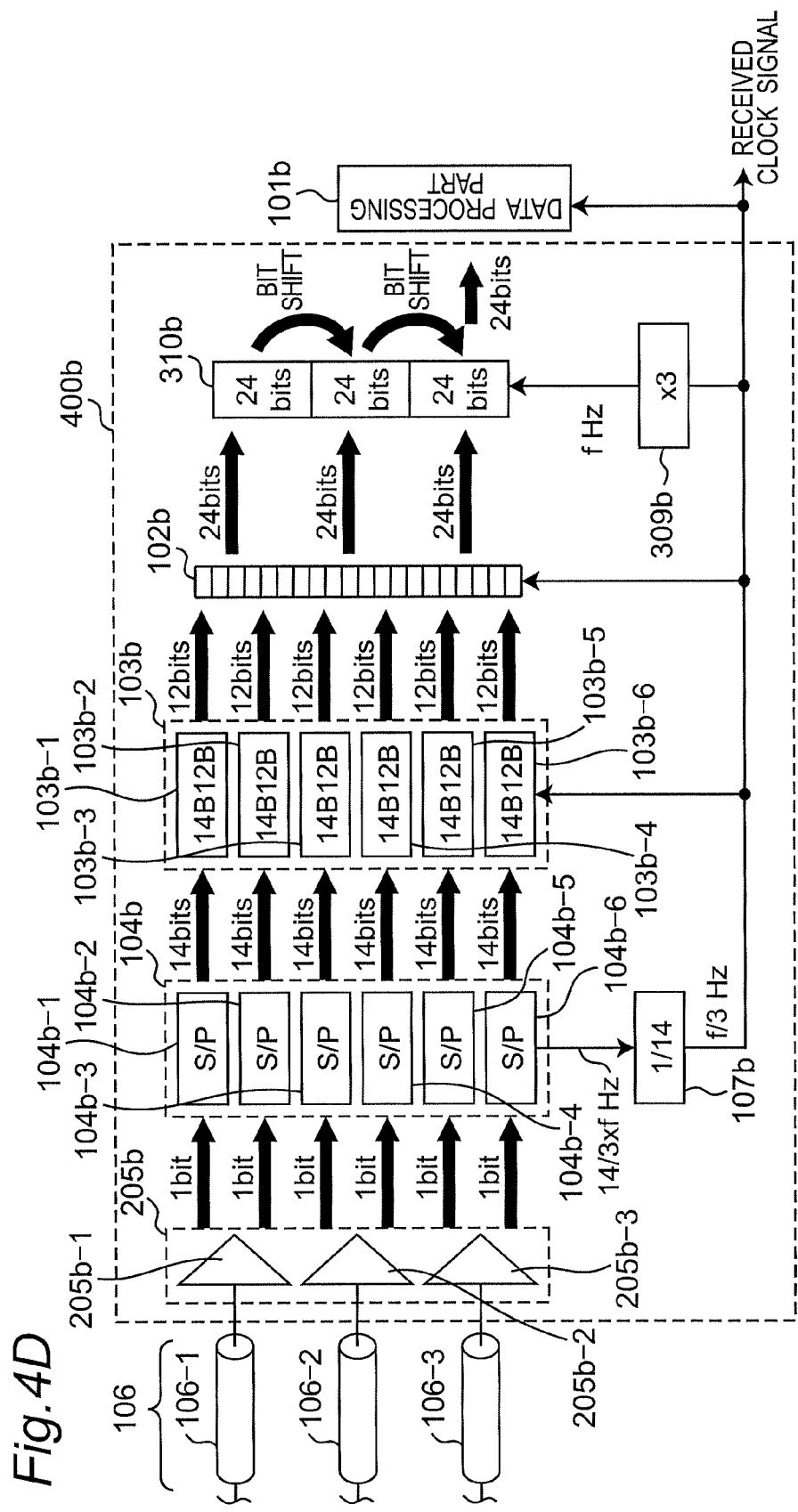
FIG. 4D is a block diagram showing a configuration of a receiver apparatus 400b of the serial transmission system for performing the 24-bit data transfer of the modified embodiment of the fourth embodiment of the present disclosure.

FIG. 4D is a block diagram showing a configuration of a receiver apparatus 400*b* of the serial transmission system for performing the 24-bit data transfer of the modified embodiment of the fourth embodiment of the present disclosure. The receiver apparatus 400*b* shown in FIG. 4D further includes a 3-fold multiplier circuit 309*b* in place of the 2-fold multiplier circuit 309*b*, as compared with the receiver apparatus 400*b* of FIG. 4B, and all the circuits are operated to perform 24-bit data transfer instead of resting the receiver circuit 308*b* of 24-bit channel shown in FIG. 3B.

Referring to FIG. 4D, the shift register 310*b* stores parallel data outputted from the buffer 102*b* by using the transmitting clock signal having a frequency f/3 [Hz], performs a 24-bit bit shift twice, and outputs the resulting data to the data processing part 101*b*.

Referring to FIG. 4D, when storing once the parallel data of a total of 72 bits inputted from the buffer 102*b*, the shift register 310*b* outputs the 24-bit parallel data stored in the storage region in the lowermost portion into the data processing part 101*b*. Next, the 24-bit parallel data stored in the storage region in the center portion of the shift register 310*b* is subjected to a bit shift into the storage region in the lowermost portion of the shift register 310*b*. Next, the 24-bit parallel data stored in the storage region the uppermost portion is subjected to a bit shift into the storage region in the center portion of the shift register 310*b*. Next, the 24-bit parallel data stored in the storage region in the lowermost portion is inputted to the data processing part 101*b*. Next, the 24-bit parallel data stored in the storage region in the center portion of the shift register 310*b* is subjected to a bit shift into the storage region in the lowermost portion of the shift register 310*b*. Finally, the 24-bit parallel data stored in the storage region in the lowermost portion is outputted to the data processing part 101*b*. The transfer of the parallel data is thus performed in units of 24 bits.

The actions and effects of the serial transmission system including the transmitter apparatus 400*a*, the transmission path 106 and the receiver apparatus 400*b* as configured as above in FIGS. 4C and 4D are described below.

First of all, the serial transmission system of FIGS. 4C and 4D of the present embodiment is characterized in that three units of parallel data, whose one unit is 24-bit parallel data, can be transmitted by only three channels 106-1 to 106-3. Concretely, upon transmitting 72-bit parallel data of three units, in FIGS. 4C and 4D, the 72-bit parallel data of three units from the data processing part 101*a* is transmitted by division every 12 bits by using a 24-bit shift twice in the shift register 310*a* on the side of the transmitter apparatus 400*a*, while the parallel data transmitted by division every 12 bits is received, thereafter converted into 72-bit parallel data of three units, and thereafter outputted to the data processing part 101*b* by using a 24-bit shift twice on the side of the receiver apparatus 400*b*.

Figure 5B:
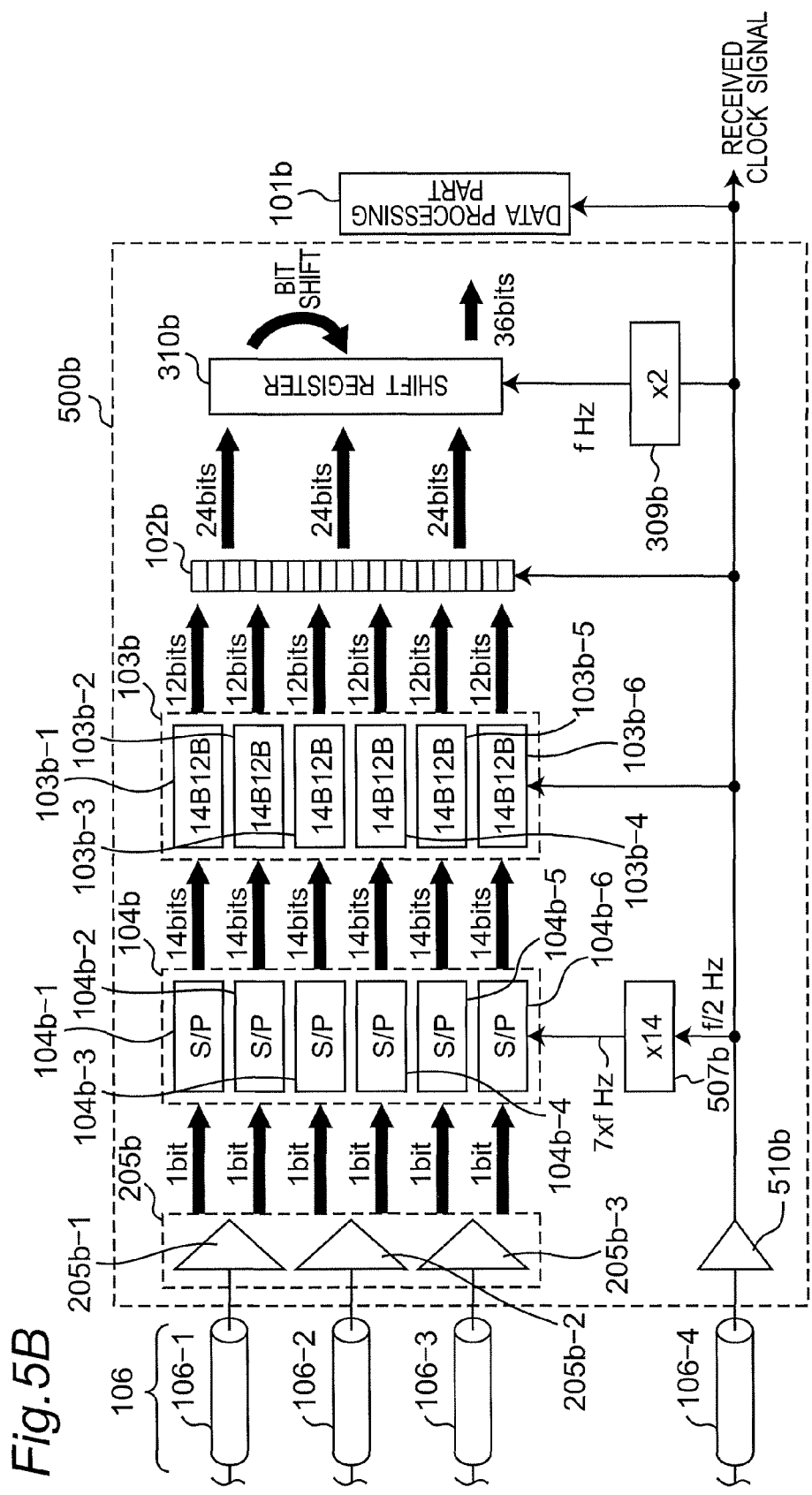
FIG. 5B is a block diagram showing a configuration of a receiver apparatus 500b of the serial transmission system for performing the 36-bit data transfer of the fifth embodiment of the present disclosure.
Figure 5C:
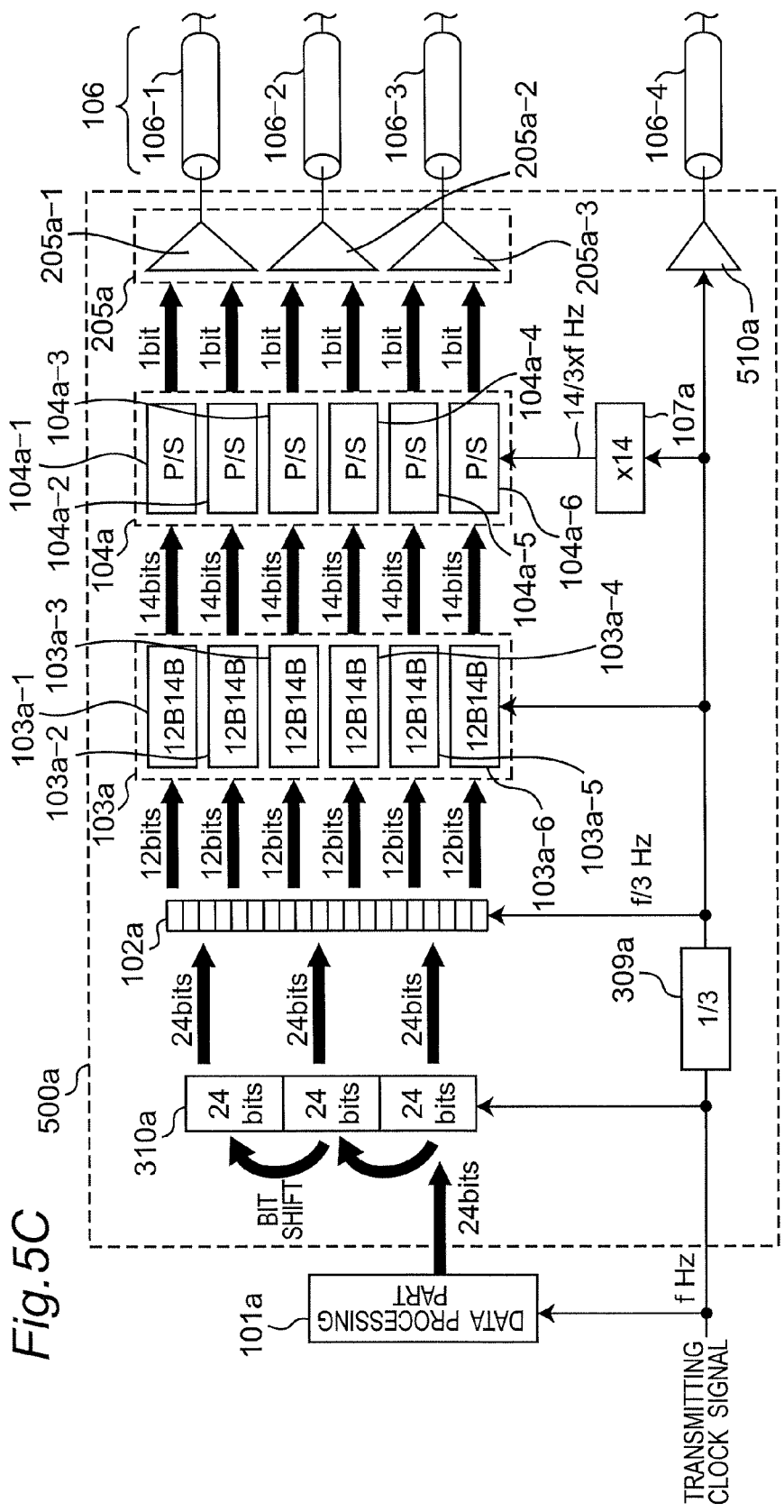
FIG. 5C is a block diagram showing a configuration of a transmitter apparatus 500a of a serial transmission system for performing 24-bit data transfer according to a modified embodiment of the fifth embodiment of the present disclosure.

Moreover, the encoder circuit 103*a* includes six 12B14B encoders 103*a*-1, 103*a*-2, 103*a*-3, 103*a*-4, 103*a*-5 and 103*a*-6 to convert 12-bit parallel data into 14-bit parallel data in the transmitter apparatus 400*a* of FIG. 4C of the present embodiment, while the decoder circuit 103*b* includes six 14B12B encoders 103*b*-1, 103*b*-2, 103*b*-3, 103*b*-4, 103*b*-5 and 103*b*-6 to convert 14-bit parallel data into 12-bit parallel data in the receiver apparatus 400b of FIG. 5C. Therefore, 12-bit data processing can be efficiently executed.

According to the serial transmission system of the above embodiment, the 36-bit data processing and data transfer can be achieved with a simple circuit configuration by using the transmission path parts 106-1, 106-2 and 106-3 of three channels. Upon transmitting the 36-bit data, a data efficiency of 171.4% per channel in terms of binary transmission can be achieved, which is higher than 80% when the prior art 8B10B transmission system (transmission frequency is 10f [Hz], and the number of transmission channels is three) is used, and a total data efficiency of 171.4% can be achieved, which is higher than 80% when the prior art 8B10B transmission system (transmission frequency is 10f [Hz], and the number of transmission channels is three) is used.

Further, according to the serial transmission system of the present embodiment, 24-bit data processing and data transfer can be achieved with a simple circuit configuration by using the transmission path parts 106-1, 106-2 and 106-3 of three channels. Upon transmitting the 24-bit data, a data efficiency of 171.4% per channel in terms of binary transmission can be achieved, which is higher than 80% when the prior art 8B 10B transmission system (transmission frequency is 10f [Hz], and the number of transmission channels is three) is used, and a total data efficiency of 171.4% can be achieved, which is higher than 80% when the prior art 8B10B transmission system (transmission frequency is 10f [Hz], and the number of transmission channels is three) is used.

As described above, according to the present embodiment, the baseband signal of the transmission signal is generated by using the 12B14B encoders 103a-1 to 103a-6 that generate the 14-bit parallel data with the DC balance secured, and therefore, serial data transmission capable of more reliably performing the clock regeneration and data synchronization becomes possible. Furthermore, according to the present embodiment, the serial transmission with the transmission speed suppressed to a half becomes possible with the data efficiency maintained at the time of transmitting the 36-bit data, and the serial transmission with the transmission speed suppressed to one third becomes possible with the data efficiency maintained at the time of transmitting the 24-bit data, as compared with the configuration of the third embodiment.

Fifth Embodiment

FIG. 5A is a block diagram showing a configuration of a transmitter apparatus 500a of a serial transmission system for performing 36-bit data transfer according to the fifth embodiment of the present disclosure. The transmitter apparatus 500a shown in FIG. 5A is characterized in that a binary driver circuit 510a for transmitting a clock signal for synchronization is further provided, as compared with the transmitter apparatus 400a of FIG. 4A. Referring to FIG. 5A, the binary driver circuit 510a amplifies a signal obtained by dividing the transmitting clock signal having the frequency f [Hz] to one half, and transmits the clock signal for synchronization on the side of the receiver apparatus 500b to the transmission path part 106-4.

FIG. 5B is a block diagram showing a configuration of a receiver apparatus 500b of the serial transmission system for performing the 36-bit data transfer of the fifth embodiment of the present disclosure. The receiver apparatus 500b shown in FIG. 5B is characterized in that a binary receiver circuit 510b for receiving the clock signal for synchronization is further provided, as compared with the receiver apparatus 400b of FIG. 4B. Referring to FIG. 5B, the binary receiver circuit 510b amplifies the clock signal for synchronization having the frequency f/2 [Hz] from the transmission path part 106-4 to generate a received clock signal, and outputs the resulting signal to a 14-fold multiplier circuit 507b, the 14B12B decoders 103b-1, 103b-2, 103b-3, 103b-4, 103b-5 and 103b-6, the buffer 102b, the 2-fold multiplier circuit 309b and the data processing parts 101b.

The actions and effects of the serial transmission system including the transmitter apparatus 500a, the transmission path 106 and the receiver apparatus 500b as configured as above are described below.

The serial transmission system of the present embodiment, which includes the binary driver circuit 510a, the transmission path part 106-4, and therefore, the binary receiver circuit 510b in addition to the configuration of the serial transmission system including the transmitter apparatus 400a and the receiver apparatus 400b of FIGS. 4A and 4B, is able to transmit the clock signal for synchronization on the side of the transmitter apparatus 500a to the side of the receiver apparatus 500b concurrently with the serial data transmitted via the transmission path parts 106-1 to 106-3, allowing the clock regeneration and data synchronization to be performed more reliably.

FIG. 5C is a block diagram showing a configuration of a transmitter apparatus 500a of a serial transmission system for performing 24-bit data transfer according to a modified embodiment of the fifth embodiment of the present disclosure. The transmitter apparatus 500a of FIG. 5C is characterized in that a binary driver circuit 510a for transmitting the clock signal for synchronization is further provided, as compared with the transmitter apparatus 400a of FIG. 4C. With this arrangement, the clock signal for synchronization can be transmitted to the side of the receiver apparatus 500b via the transmission path part 106-4.

Figure 5D:
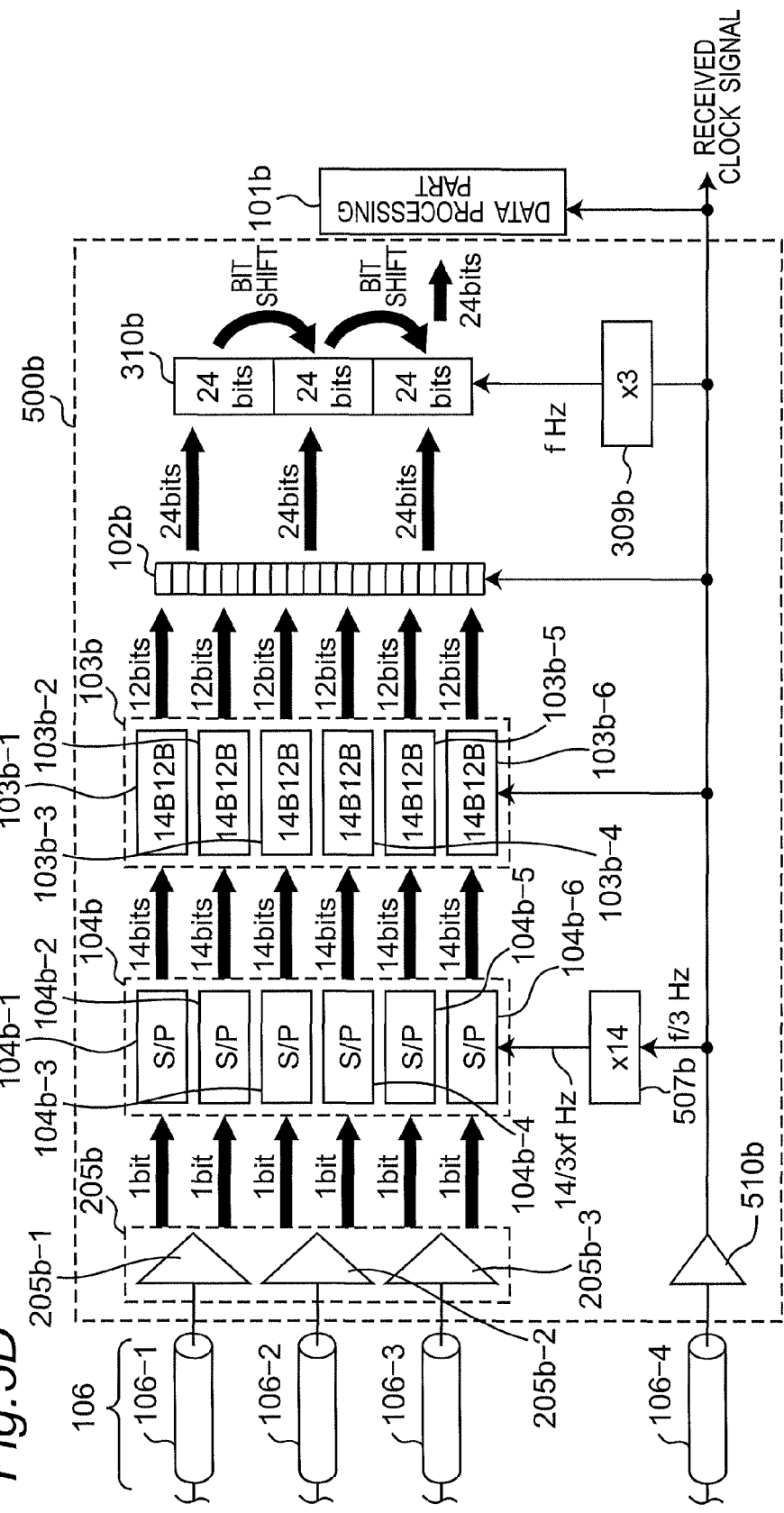
FIG. 5D is a block diagram showing a configuration of a receiver apparatus 500b of the serial transmission system for performing the 24-bit data transfer of the modified embodiment of the fifth embodiment of the present disclosure.

FIG. 5D is a block diagram showing a configuration of a receiver apparatus 500b of the serial transmission system for performing the 24-bit data transfer of the modified embodiment of the fifth embodiment of the present disclosure. The receiver apparatus 500b of FIG. 5D is characterized in that a binary receiver circuit 510b for receiving the clock signal for synchronization is further provided, as compared with the receiver apparatus 400b of FIG. 4D. With this arrangement, the clock signal for synchronization can be received via the transmission path part 106-4.

The actions and effects of the serial transmission system including the transmitter apparatus 500a, the transmission path 106 and the receiver apparatus 500b as configured as above are described below.

The serial transmission system of the present embodiment, which includes the binary driver circuit 510a, the transmission path part 106-4 and the binary receiver circuit 510b in addition to the configuration of the serial transmission system including the transmitter apparatus 400a and the receiver apparatus 400b of FIGS. 4C and 4D, is therefore able to transmit the clock signal for synchronization on the side of the transmitter apparatus 500a to the side of the receiver apparatus 500b concurrently with the serial data transmitted via the transmission path parts 106-1 to 106-3, allowing the clock regeneration and data synchronization to be performed more reliably.

According to the serial transmission system of the above embodiment, the 36-bit data processing and data transfer can be achieved with a simple circuit configuration by using the transmission path parts 106-1, 106-2, 106-3 and 106-4 of four channels. Upon transmitting the 36-bit data, a data efficiency of 171.4% per channel in terms of binary transmission can be achieved, which is higher than 80% when the prior art 8B10B transmission system (transmission frequency is 10f [Hz], and the number of transmission channels is three) is used, and a total data efficiency of 171.4% can be achieved, which is higher than 80% when the prior art 8B10B transmission system (transmission frequency is 10f [Hz], and the number of transmission channels is three) is used.

Further, according to the serial transmission system of the present embodiment, the 24-bit data processing and data transfer can be achieved with a simple circuit configuration by using the transmission path parts 106-1, 106-2, 106-3 and 106-4 of four channels. Upon transmitting the 24-bit data, a data efficiency of 171.4% per channel in terms of binary transmission can be achieved, which is higher than 80% when the prior art 8B10B transmission system (transmission frequency is 10f [Hz], and the number of transmission channels is three) is used, and a total data efficiency of 171.4% can be achieved, which is higher than 80% when the prior art 8B10B transmission system (transmission frequency is 10f [Hz], and the number of transmission channels is three) is used.

As described above, according to the present embodiment, the baseband signal of the transmission signal is generated by using the 12B14B encoders 103a-1 to 103a-6 that generate the 14-bit parallel data with the DC balance secured, and therefore, serial data transmission capable of more reliably performing the clock regeneration and data synchronization becomes possible. Furthermore, according to the present embodiment, the serial transmission with the transmission speed suppressed to a half becomes possible with the data efficiency maintained at the time of transmitting the 36-bit data, and the serial transmission with the transmission speed suppressed to one third becomes possible with the data efficiency maintained at the time of transmitting the 24-bit data, as compared with the configuration of the third embodiment. Furthermore, according to the present embodiment, regeneration of the synchronization clock, data synchronization, simplification of clock transmission, suppression of interference with the parallel data, and frequency reduction of noise radiation become possible more reliably, as compared with the configuration of the fourth embodiment.

As a modified embodiment of the fifth embodiment, an output signal from the multiplier circuit 107a may be used as an input signal to the binary driver circuit 510a of FIGS. 5A and 5C. In the above case, a ¹/₁₄-fold divider circuit is needed in place of the 14-fold multiplier circuit 507b of FIGS. 5B and 5D so that the frequency of the clock signal beneficial to operating the decoder circuit 103b, the buffer 102b, the multiplier circuit 309b and the data processing part 101b is set to ¹/₁₄-fold of the frequency owned by the output signal from the binary receiver circuit 510.

In the above fifth embodiment and its modified embodiment, the configuration in which the binary driver circuit 510a and the receiver circuit 510b are used for transmitting and receiving the clock signal for synchronization has been described. However, the present disclosure is not limited to this, and a configuration in which the same quadri-valued driver circuit and receiver circuit as those employed in the data channel may be used in order to match the skew with the data channel.

Sixth Embodiment

Figure 6A:
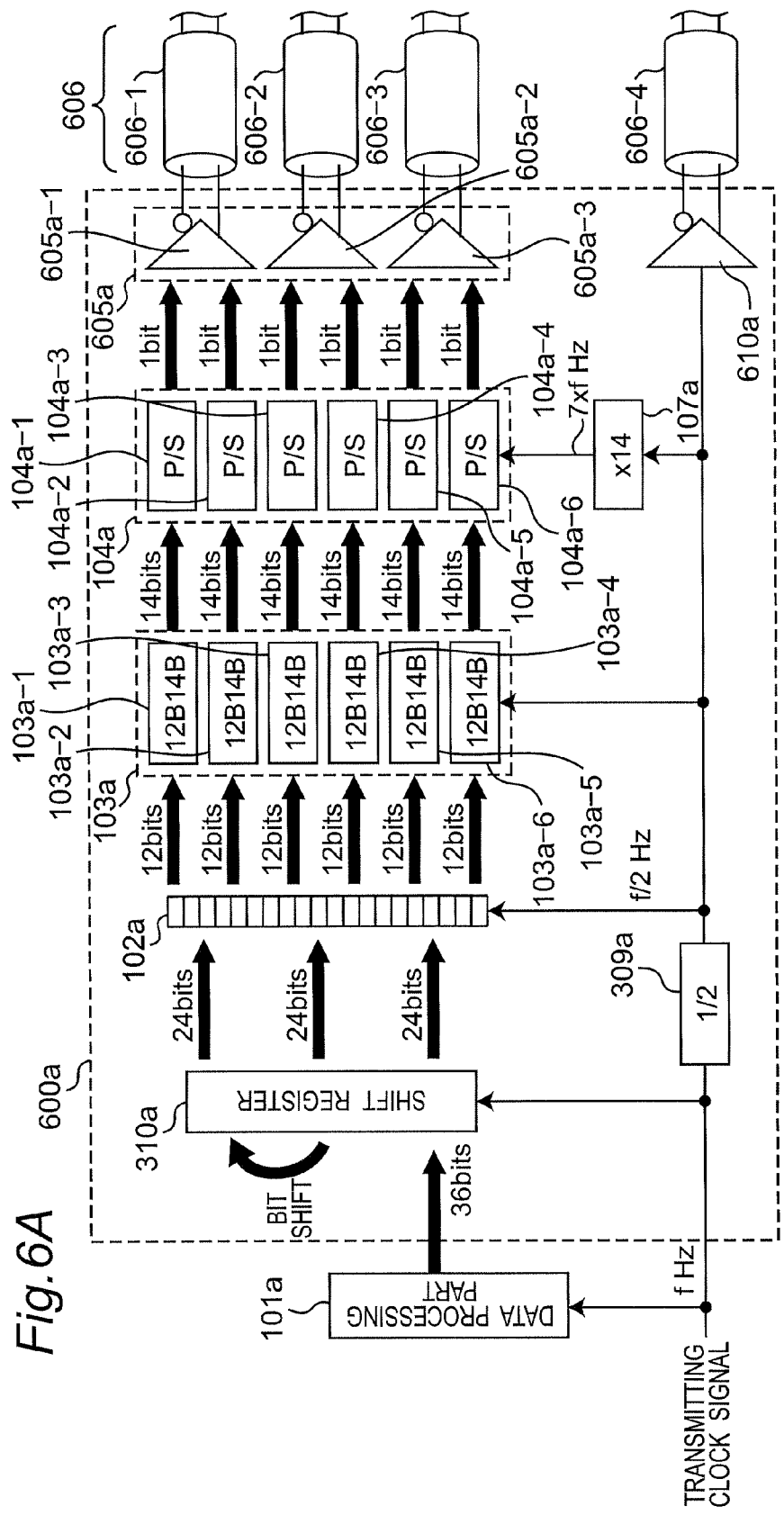
FIG. 6A is a block diagram showing a configuration of a transmitter apparatus 600a of a serial transmission system for performing 36-bit data transfer according to a sixth embodiment of the present disclosure.

FIG. 6A is a block diagram showing a configuration of a transmitter apparatus 600a of a serial transmission system for performing 36-bit data transfer according to the sixth embodiment of the present disclosure. The transmitter apparatus 600a shown in FIG. 6A is characterized in that differential quadri-valued driver circuit parts 605a-1, 605a-2 and 605a-3 are provided in place of the quadri-valued driver circuit parts 205a-1, 205a-2 and 205a-3, and a differential binary driver circuit 610a is provided in place of the binary driver circuit 510a, as compared with the transmitter apparatus 500a of FIG. 5A. It is further characterized in that differential transmission path parts 606-1, 606-2, 606-3 and 606-4 are provided in place of the transmission path parts 106-1, 106-2, 106-3 and 106-4 shown in FIG. 5A.

Referring to FIG. 6A, the differential quadri-valued driver circuit parts 605a-1, 605a-2 and 605a-3 each amplify a high-speed signal, which has undergone parallel-to-serial conversion, to generate a differential quadri-valued transmission signal, and transmit the resulting signals to the differential transmission path parts 606-1, 606-2 and 606-3. Moreover, the differential binary driver circuit 610a amplifies a signal obtained by dividing the transmitting clock signal having the frequency f [Hz] to one half, and outputs the clock signal for synchronization on the side of the receiver apparatus 600b to the differential transmission path part 606-4.

Figure 6B:
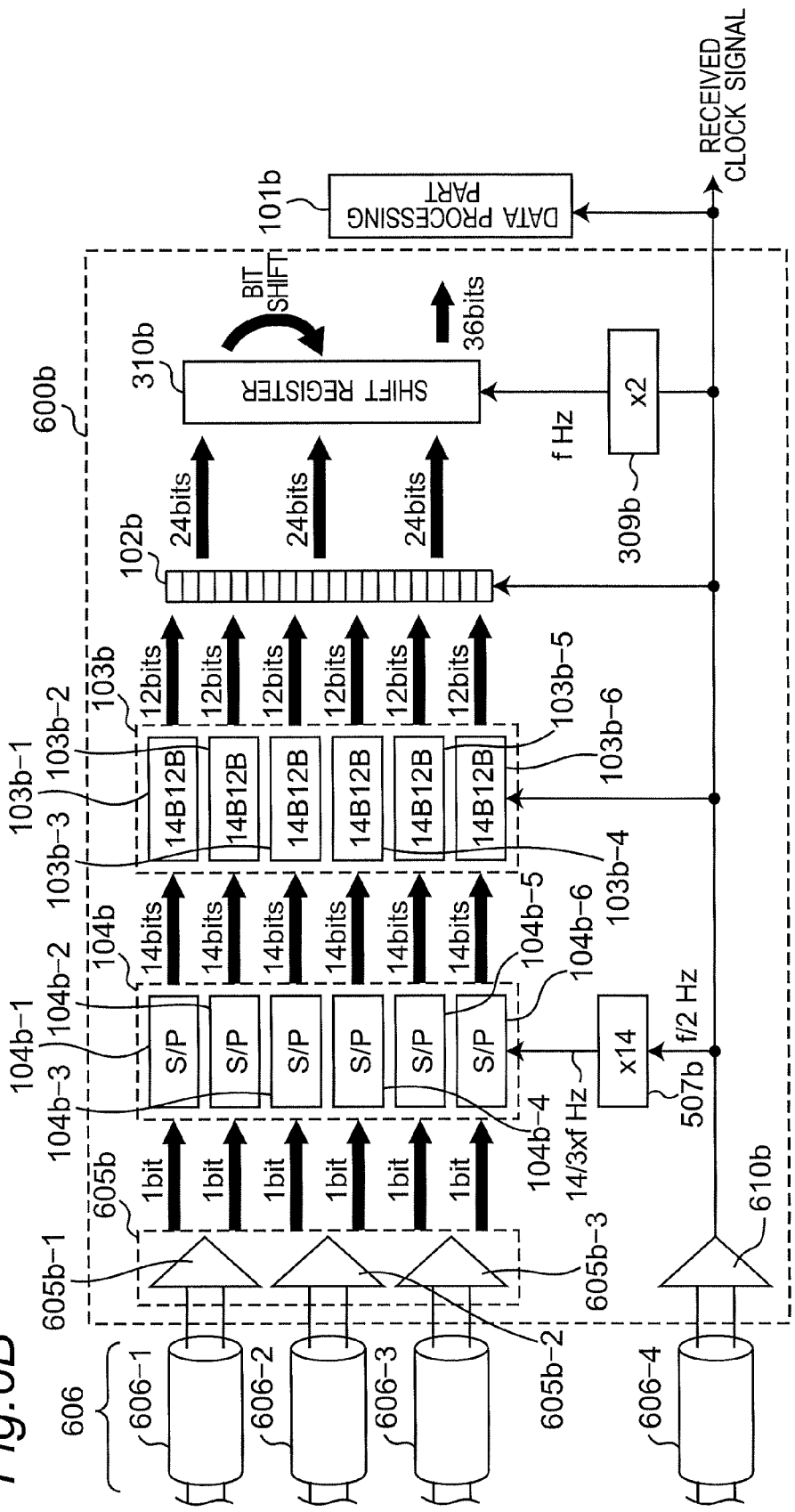
FIG. 6B is a block diagram showing a configuration of a receiver apparatus 600b of the serial transmission system for performing the 36-bit data transfer of the sixth embodiment of the present disclosure.

FIG. 6B is a block diagram showing a configuration of a receiver apparatus 600b of the serial transmission system for performing the 36-bit data transfer of the sixth embodiment of the present disclosure. The receiver apparatus 600b shown in FIG. 6B is characterized in that differential quadri-valued driver circuit parts 605b-1, 605b-2 and 605b-3 are provided in place of the quadri-valued receiver circuit parts 205b-1, 205b-2 and 205b-3, and a differential binary receiver circuit 610a is provided in place of the binary receiver circuit 510b, as compared with the receiver apparatus 500b of FIG. 5B. It is further characterized in that differential transmission path parts 606-1, 606-2, 606-3 and 606-4 are provided in place of the transmission path parts 106-1, 106-2, 106-3 and 106-4 shown in FIG. 5B.

Referring to FIG. 6B, the differential quadri-valued receiver circuit part 605b-1 receives and amplifies a differential quadri-valued transmission signal from the differential transmission path part 606-1 to generate two 1-bit serial data, and thereafter, outputs the 1-bit serial data to the serial-to-parallel converter circuit parts 104b-1 and 104b-2. In this case, the operations of the differential quadri-valued receiver circuit parts 605b-2 and 605b-3 are similar to the operation of the differential quadri-valued receiver circuit part 605b-1. Moreover, the differential binary receiver circuit 510b amplifies the clock signal for synchronization having the frequency f/2 [Hz] from the side of the transmitter apparatus 500a to generate a received clock signal, and outputs the resulting signal to the 14-fold multiplier circuit 507b, the decoder circuit 103b, the buffer 102b, the 2-fold multiplier circuit 309b, and the data processing part 101b.

The actions and effects of the serial transmission system including the transmitter apparatus 600a, the differential transmission path 106 and the receiver apparatus 600b as configured as above are described below.

The serial transmission system of the present embodiment, which includes the differential quadri-valued driver circuit parts 605a-1 to 605a-3 in place of the quadri-valued driver circuit parts 205a-1 to 205a-3, respectively, of FIG. 5A, the differential transmission path parts 606-1 to 606-4 in place of the transmission path parts 106-1 to 106-4, respectively, of FIGS. 5A and 5B, the differential binary driver circuit 610a in place of the binary driver circuit 510a of FIG. 5A, and further the differential binary receiver circuit 610b in place of the binary receiver circuit 510b of FIG. 5B, is therefore able to make it easy to increase the speed of high-speed transmission, reduce noises and have high noise resistance.

FIG. 6C is a block diagram showing a configuration of a transmitter apparatus 600a of a serial transmission system for performing 24-bit data transfer according to a modified embodiment of the sixth embodiment of the present disclosure. The transmitter apparatus 600a of FIG. 6C is characterized in that differential quadri-valued driver circuit parts 605a-1, 605a-2 and 605a-3 are provided in place of the quadri-valued driver circuit parts 205a-1, 205a-2 and 205a-3, and a differential binary driver circuit 610a is provided in place of the binary driver circuit 510a, as compared with the transmitter apparatus 500a of FIG. 5C. It is further characterized in that differential transmission path parts 606-1, 606-2, 606-3 and 606-4 are provided in place of the transmission path parts 106-1, 106-2, 106-3 and 106-4 shown in FIG. 5C.

Figure 6D:
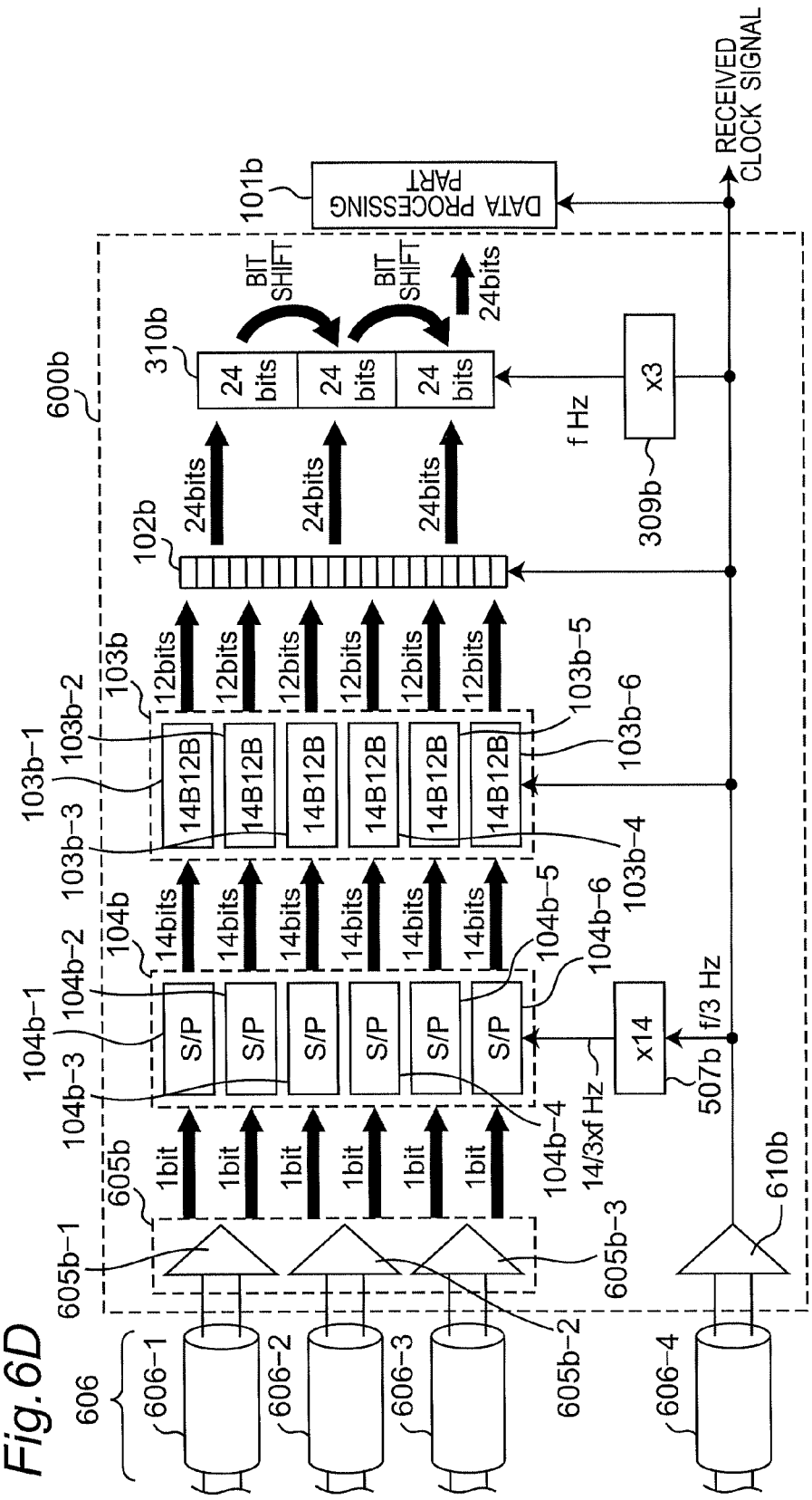
FIG. 6D is a block diagram showing a configuration of a receiver apparatus 600b of the serial transmission system for performing the 24-bit data transfer of the modified embodiment of the sixth embodiment of the present disclosure.

FIG. 6D is a block diagram showing a configuration of a receiver apparatus 600b of the serial transmission system for performing the 24-bit data transfer of the modified embodiment of the sixth embodiment of the present disclosure. The receiver apparatus 600b shown in FIG. 6D is characterized in that differential quadri-valued receiver circuit parts 605b-1, 605b-2 and 605b-3 are provided in place of the quadri-valued receiver circuit parts 205b-1, 205b-2 and 205b-3, and a differential binary receiver circuit 610b is provided in place of the binary receiver circuit 510b, as compared with the receiver apparatus 500b of FIG. 5D. It is further characterized in that differential transmission path parts 606-1, 606-2, 606-3 and 606-4 are provided in place of the transmission path parts 106-1, 106-2, 106-3 and 106-4 shown in FIG. 5D.

The actions and effects of the serial transmission system including the transmitter apparatus 600a, the differential transmission path 606 and the receiver apparatus 600b as configured as above are described below.

The serial transmission system of the present embodiment, which includes the differential quadri-valued driver circuit parts 605a-1 to 605a-3 in place of the quadri-valued driver circuit parts 205a-1 to 205a-3, respectively, of FIG. 5C, the differential transmission path parts 606-1 to 606-4 in place of the transmission path parts 106-1 to 106-4, respectively, of FIGS. 5C and 5D, the differential binary driver circuit 610a in place of the binary driver circuit 510a of FIG. 5C, and further the differential binary receiver circuit 610b in place of the binary receiver circuit 510b of FIG. 5D, is therefore able to make it easy to increase the speed of high-speed transmission, reduce noises and have high noise resistance.

According to the serial transmission system of the above embodiment, the 36-bit data processing and data transfer can be achieved with a simple circuit configuration by using the differential transmission path parts 606-1, 606-2, 606-3 and 606-4 of four channels. Upon transmitting the 36-bit data, a data efficiency of 171.4% per channel in terms of binary transmission can be achieved, which is higher than 80% when the prior art 8B10B transmission system (transmission frequency is 10f [Hz], and the number of transmission channels is three) is used, and a total data efficiency of 171.4% can be achieved, which is higher than 80% when the prior art 8B10B transmission system (transmission frequency is 10f [Hz], and the number of transmission channels is three) is used.

Further, according to the serial transmission system of the present embodiment, the 24-bit data processing and data transfer can be achieved with a simple circuit configuration by using the transmission path parts 606-1, 606-2, 606-3 and 606-4 of four channels. Upon transmitting the 24-bit data, a data efficiency of 171.4% per channel in terms of binary transmission can be achieved, which is higher than 80% when the prior art 8B10B transmission system (transmission frequency is 10f [Hz], and the number of transmission channels is three) is used, and a total data efficiency of 171.4% can be achieved, which is higher than 80% when the prior art 8B10B transmission system (transmission frequency is 10f [Hz], and the number of transmission channels is three) is used.

As described above, according to the present embodiment, the baseband signal of the transmission signal is generated by using the 12B14B encoders 103a-1 to 103a-6 that generate the 14-bit parallel data with the DC balance secured, and therefore, serial data transmission capable of more reliably performing the clock regeneration circuit and data synchronization becomes possible. Furthermore, according to the present embodiment, the serial transmission with the transmission speed suppressed to a half becomes possible with the data efficiency maintained at the time of transmitting the 36-bit data, and serial transmission with the transmission speed suppressed to one third becomes possible with the data efficiency maintained at the time of transmitting the 24-bit data, as compared with the configuration of the third embodiment. Furthermore, according to the present embodiment, regeneration of the synchronization clock, data synchronization, simplification of clock transmission, suppression of interference with the parallel data, and a frequency reduction of noise radiation become possible more reliably, as compared with the configuration of the fourth embodiment. Furthermore, according to the present embodiment, simplification of high-speed transmission, noise reduction, and high noise resistance become possible, as compared with the configuration of the fifth embodiment.

As a modified embodiment of the sixth embodiment, an output signal from the multiplier circuit 107a may be used for an input signal to the differential binary driver circuit 610a of FIGS. 6A and 6C. In the above case, a ¹⁄₁₄-fold divider circuit is needed in place of the 14-fold multiplier circuit 507b of FIGS. 6B and 6D so that the frequency of the clock signal beneficial to operating the decoder circuit 103b, the buffer 102b, the multiplier circuit 309b and the data processing part 101b is set to ¹⁄₁₄-fold of the frequency owned by the output signal from the differential binary receiver circuit 610b.

In the above sixth embodiment and its modified embodiment, the configuration in which the binary differential driver circuit 610a and the differential receiver circuit 610b are used for transmitting and receiving the clock signal for synchronization has been described. However, the present disclosure is not limited to this, and a configuration in which the same quadri-valued differential driver circuit and the differential receiver circuit as those employed in the data channel may be used in order to match the skew with the data channel.

Modified Embodiments

In the serial transmission system of the aforementioned embodiments as configured as above, the serial transmission system in which the 24-bit or 36-bit parallel data is transmitted as a 1-bit or 2-bit transmission signal has been described. However, the present disclosure is not limited to the aforementioned embodiments but allowed to be applied to, for example, a serial transmission system, which includes a transmitter apparatus having a driver circuit of natural number m bits, a receiver apparatus having a receiver circuit of m bits, and a transmission path capable of transmitting a transmission signal of m bits, and in which parallel data of natural number n×12 bits is transmitted as a transmission signal of m bits, as a modified embodiment of the aforementioned embodiments.

For example, in a serial transmission system in which the parallel data of n×12 bits is transmitted as a transmission signal of m bits, a transmitter apparatus that converts parallel data of n×12 bits into n serial data and transmits each transmission signal of m bits is provided. The transmitter apparatus includes a dividing buffer that divides the inputted parallel data into n 12-bit parallel data every 12 bits, an encoder circuit that to 12B14B-converts the divided n 12-bit parallel data into 14-bit parallel data and outputs the resulting data, a parallel-to-serial converter circuit that to parallel-to-serial converts each of the n 14-bit parallel data, which has undergone 12B14B-conversion, into 1-bit serial data and outputs the resulting data, and an m-bit driver circuit that amplifies the n 1-bit serial data, which have undergone the parallel-to-serial conversion, and transmits the resulting data as a transmission signal of m bits to n transmission paths. Further, a receiver apparatus that receives each transmission signal of m bits and converts n serial data into parallel data is provided, and the receiver apparatus includes an m-bit receiver circuit that receives each transmission signal of m bits from the n transmission paths and generates 1-bit serial data, a serial-to-parallel converter circuit that serial-to-parallel converts the aforementioned generated n 1-bit serial data into n 14-bit parallel data and generates a clock signal for synchronization from at least one of the n serial data, and a decoder circuit that 14B12B-converts the n 14-bit parallel data, which have undergone serial-to-parallel conversion, into n 12-bit parallel data by using the clock signal for synchronization and outputs the resulting data.

Moreover, the serial transmission system in which the transmitter apparatus and the receiver apparatus of the serial transmission systems of the aforementioned embodiments further includes respective shift registers 310a and 310b, performs the bit shift of parallel data twice for 24 bits or one time for 36 bits, and three units or two units of parallel data, whose one unit is 24-bit or 36-bit parallel data, are converted into six serial data, has been described. However, the present disclosure is not limited to the aforementioned embodiments but allowed to be applied to, for example, a serial transmission system, in which parallel data of (n×12) bits is subjected to a bit shift of (n×12) bits p times in a shift register having a storage region of (natural number p×n×12) bits and transmitted as a transmission signal of m bits, as a modified embodiment of the aforementioned embodiments.

For example, the serial transmission system includes a transmitter apparatus that converts p units of parallel data, whose one unit is n×12-bit parallel data, into (n×p) serial data and transmits each transmission signal of m bits. The transmitter apparatus includes dividing buffer that divides the inputted parallel data into (n×p) 12-bit parallel data every 12 bits, an encoder circuit that 12B14B-converts the aforementioned divided (n×p) 12-bit parallel data each into 14-bit parallel data and outputs the resulting data, a parallel-to-serial converter circuit that converts the (n×p) 14-bit parallel data, which have undergone the 12B14B-conversion, each into 1-bit serial data and outputs the resulting data, and an m-bit driver circuit that amplifies the (n×p) 1-bit serial data, which have undergone the parallel-to-serial conversion, and transmits the resulting data as a transmission signal of m bits to q (q is a minimum natural number being equal to or larger than ((n×p)/m)) transmission paths.

Further, the above serial transmission system includes a receiver apparatus that receives each transmission signal of m bits and converts (n×p) serial data into 12-bit parallel data. The receiver apparatus includes an m-bit receiver circuit that receives each transmission signal of m bits from the (n×p) transmission paths and generates each 1-bit serial data, a serial-to-parallel converter circuit that serial-to-parallel converts the aforementioned generated (n×p) 1-bit serial data into (n×p) 14-bit parallel data and generates a clock signal for synchronization from at least one of the (n×p) serial data, and a decoder circuit that to 14B12B-converts (n×p) 14-bit parallel data, which have undergone the serial-to-parallel conversion, into (n×p) 12-bit parallel data by using the clock signal for synchronization, and outputs the resulting data.

As described in detail above, according to the transmitter apparatus, the receiver apparatus and the serial transmission system of the present disclosure, the clock regeneration and data synchronization can be performed reliably with the data efficiency improved, and the transmission speed can be further suppressed. Therefore, it is useful for high-speed transmission of AV data dominated by 24-bit, 36-bit and 48-bit data transfer.

SUMMARY OF EMBODIMENTS

According to a first aspect of the present disclosure, there is provided a transmitter apparatus for converting parallel data of natural number n×12 bits into n pieces of serial data, and transmitting n transmission signals each of natural number m bits. The transmitter apparatus includes a dividing buffer, an encoder circuit, a parallel-to-serial converter circuit, and an m-bit driver circuit. The dividing buffer is configured to divide inputted parallel data into n pieces of 12-bit parallel data, and the encoder circuit is configured to 12B14B-convert the n pieces of 12-bit parallel data into n pieces of 14-bit parallel data, respectively, and output resulting data. The parallel-to-serial converter circuit is configured to parallel-to-serial convert the n pieces of 14-bit parallel data into n pieces of 1-bit serial data, respectively, and output resulting data. The m-bit driver circuit configured to amplify and transmit the n pieces of 1-bit serial data, as n transmission signals each of m bits, respectively, to n transmission paths.

According to a second aspect of the present disclosure, there is provided a transmitter apparatus for converting parallel data of natural number p units, whose one unit is parallel data of natural number n×12 bits, into (n×p) pieces of serial data, and transmitting n transmission signals each of natural number m bits. The transmitter apparatus includes a dividing buffer, an encoder circuit, a parallel-to-serial converter circuit, and an m-bit driver circuit. The dividing buffer is configured to divide inputted parallel data into (n×p) pieces of 12-bit parallel data, and the encoder circuit is configured to 12B14B-convert the (n×p) pieces of 12-bit parallel data into (n×p) pieces of 14-bit parallel data, respectively, and output resulting data. The parallel-to-serial converter circuit is configured to parallel-to-serial convert the (n×p) pieces of 14-bit parallel data into (n×p) pieces of 1-bit serial data, and output resulting data. The m-bit driver circuit is configured to amplify and transmit the (n×p) pieces of 1-bit serial data, as n transmission signals each of m bits, respectively, to q transmission paths, where q is a minimum natural number equal to or larger than (n×p)/m.

In the above-mentioned transmitter apparatus of the second aspect of the present disclosure, the dividing buffer includes a shift register configured to have a storage region of (n×12×p) bits, and divide data of (n×12×p) bits into (n×p) pieces of 12-bit parallel data by a bit shift of (n×12) bits with the shift register.

In the above-mentioned transmitter apparatus of the first and second aspect of the present disclosure, the m-bit driver circuit is a differential m-bit driver circuit.

In the above-mentioned transmitter apparatus of the first and second aspects of the present disclosure, the transmitter apparatus further includes a clock driver circuit configured to transmit a clock signal for synchronization used in the transmitter apparatus to a further transmission path.

In this case, the clock driver circuit is a differential clock driver circuit.

According to a third aspect of the present disclosure, there is provided a receiver apparatus for receiving natural number n transmission signals each of natural number m bits, and converting n pieces of serial data into n pieces of parallel data, respectively. The receiver apparatus includes an m-bit receiver circuit, a serial-to-parallel converter circuit, and a decoder circuit. The m-bit receiver circuit is configured to receive n transmission signals each of natural number m bits from n transmission paths, and generate n pieces of 1-bit serial data, respectively. The serial-to-parallel converter circuit is configured to serial-to-parallel convert the n pieces of 1-bit serial data into n pieces of 14-bit parallel data, respectively, and generate a clock signal for synchronization from at least one piece of the n pieces of 1-bit serial data. The decoder circuit is configured to 14B12B-convert the n pieces of 14-bit parallel data into n pieces of 12-bit parallel data, respectively, by using the clock signal for synchronization, and output resulting data.

According to a fourth aspect of the present disclosure, there is provided a receiver apparatus for receiving (n×p) transmission signals each of natural number m bits, and converting (n×p) pieces of serial data into n×p pieces of 12-bit parallel data, where n and p are natural numbers. The receiver apparatus includes an m-bit receiver circuit, a serial-to-parallel converter circuit, and a decoder circuit. The m-bit receiver circuit is configured to receive (n×p) transmission signals each of natural number m bits from (n×p) transmission paths, respectively, and generate (n×p) pieces of 1-bit serial data. The serial-to-parallel converter circuit is configured to serial-to-parallel convert the (n×p) pieces of 1-bit serial data into (n×p) pieces of 14-bit parallel data, respectively, and generate a clock signal for synchronization from at least one of the (n×p) pieces of 1-bit serial data. The decoder circuit is configured to 14B12B-convert the (n×p) pieces of 14-bit parallel data into (n×p) pieces of 12-bit parallel data by using the clock signal for synchronization, and output resulting data.

In the above-mentioned receiver apparatus of the fourth aspect of the present disclosure, the receiver apparatus further includes an output buffer configured to input the (n×p) pieces of 12-bit parallel data outputted from the decoder circuit and output the inputted data as p pieces of (n×12)-bit parallel data. The output buffer includes a shift register configured to have a storage region of (n×12×p) bits, and output the (n×p) pieces of 12-bit parallel data as p pieces of (n×12)-bit parallel data by a (n×12)-bit shift with the shift register.

In the above-mentioned receiver apparatus of the third and fourth aspects of the present disclosure, the m-bit receiver circuit is a differential m-bit receiver circuit.

In the above-mentioned receiver apparatus of the third and fourth aspects of the present disclosure, the receiver apparatus further includes a clock receiver circuit configured to receive a clock signal for synchronization used in the receiver apparatus from a further transmission path. In this case, the clock receiver circuit is a differential clock receiver circuit.

According to a fifth aspect of the present disclosure, there is provided a serial transmission system including a transmitter apparatus and a receiver apparatus. The transmitter apparatus is configured to convert parallel data of natural number n×12 bits into n pieces of serial data, and transmit n transmission signals each of natural number m bits. The transmitter apparatus includes a dividing buffer, an encoder circuit, a parallel-to-serial converter circuit, and an m-bit driver circuit. The dividing buffer is configured to divide inputted parallel data into n pieces of 12-bit parallel data, and the encoder circuit is configured to 12B14B-convert the n pieces of 12-bit parallel data into n pieces of 14-bit parallel data, respectively, and output resulting data. The parallel-to-serial converter circuit is configured to parallel-to-serial convert the n pieces of 14-bit parallel data into n pieces of 1-bit serial data, respectively, and output resulting data. The m-bit driver circuit is configured to amplify and transmit the n pieces of 1-bit serial data, as n transmission signals each of m bits, respectively, to n transmission paths.

The receiver apparatus is configured to receive natural number n transmission signals each of natural number m bits, and convert n pieces of serial data into n pieces of parallel data, respectively. The receiver apparatus includes an m-bit receiver circuit, a serial-to-parallel converter circuit, and a decoder circuit. The m-bit receiver circuit is configured to receive n transmission signals each of natural number m bits from n transmission paths, and generate n pieces of 1-bit serial data, respectively. The serial-to-parallel converter circuit is configured to serial-to-parallel convert the n pieces of 1-bit serial data into n pieces of 14-bit parallel data, respectively, and generate a clock signal for synchronization from at least one piece of the n pieces of 1-bit serial data. The decoder circuit is configured to 14B12B-convert the n pieces of 14-bit parallel data into n pieces of 12-bit parallel data, respectively, by using the clock signal for synchronization, and output resulting data.

According to a sixth aspect of the present disclosure, there is provided a serial transmission system including a transmitter apparatus and a receiver apparatus. The transmitter apparatus is configured to convert parallel data of natural number p units, whose one unit is parallel data of natural number n×12 bits, into (n×p) pieces of serial data, and transmit n transmission signals each of natural number m bits. The transmitter apparatus includes a dividing buffer, an encoder circuit, a parallel-to-serial converter circuit, and an m-bit driver circuit. The dividing buffer is configured to divide inputted parallel data into (n×p) pieces of 12-bit parallel data. The encoder circuit is configured to 12B14B-convert the (n×p) pieces of 12-bit parallel data into (n×p) pieces of 14-bit parallel data, respectively, and output resulting data. The parallel-to-serial converter circuit is configured to parallel-to-serial convert the (n×p) pieces of 14-bit parallel data into n×p pieces of 1-bit serial data, and output resulting data. The m-bit driver circuit is configured to amplify and transmit the (n×p) pieces of 1-bit serial data, as n transmission signals each of m bits, respectively, to q transmission paths, where q is a minimum natural number equal to or larger than (n×p)/m.

The receiver apparatus is configured to receive (n×p) transmission signals each of natural number m bits, and convert (n×p) pieces of serial data into (n×p) pieces of 12-bit parallel data, where n and p are natural numbers. The receiver apparatus includes an m-bit receiver circuit, a serial-to-parallel converter circuit, and a decoder circuit. The m-bit receiver circuit is configured to receive (n×p) transmission signals each of natural number m bits from (n×p) transmission paths, respectively, and generate (n×p) pieces of 1-bit serial data. The serial-to-parallel converter circuit is configured to serial-to-parallel convert the (n×p) pieces of 1-bit serial data into (n×p) pieces of 14-bit parallel data, respectively, and generate a clock signal for synchronization from at least one of the (n×p) pieces of 1-bit serial data. The decoder circuit is configured to 14B12B-convert the (n×p) pieces of 14-bit parallel data into (n×p) pieces of 12-bit parallel data by using the clock signal for synchronization, and output resulting data.

Although the present disclosure has been fully described in connection with the embodiments thereof with reference to the accompanying drawings, it is to be noted that various changes and modifications are apparent to those skilled in the art. Such changes and modifications are to be understood as included within the scope of the present disclosure as defined by the appended claims unless they depart therefrom.

What is claimed is:

1. A transmitter apparatus for converting parallel data of natural number n multiplied by 12 bits into n pieces of serial data, and transmitting n transmission signals each of natural number m bits, the transmitter apparatus comprising:
a dividing buffer configured to divide inputted parallel data into n pieces of 12-bit parallel data;
an encoder circuit configured to 12B14B-convert the n pieces of 12-bit parallel data into n pieces of 14-bit parallel data, respectively, and output resulting data;
a parallel-to-serial converter circuit configured to parallel-to-serial convert the n pieces of 14-bit parallel data into n pieces of 1-bit serial data, respectively, and output resulting data; and
an m-bit driver circuit configured to amplify and transmit the n pieces of 1-bit serial data, as n transmission signals each of m bits, respectively, to n transmission paths.

2. The transmitter apparatus as claimed in claim 1,
wherein the m-bit driver circuit is a differential m-bit driver circuit.

3. The transmitter apparatus as claimed in claim 1, further comprising a clock driver circuit configured to transmit a clock signal for synchronization used in the transmitter apparatus to a further transmission path.

4. The transmitter apparatus as claimed in claim 3,
wherein the clock driver circuit is a differential clock driver circuit.

5. A transmitter apparatus for converting parallel data of natural number p units, whose one unit is parallel data of natural number n multiplied by 12 bits, into (n multiplied by p) pieces of serial data, and transmitting n transmission signals each of natural number m bits, the transmitter apparatus comprising:
dividing buffer configured to divide inputted parallel data into (n multiplied by p) pieces of 12-bit parallel data;
an encoder circuit configured to 12B14B-convert the (n multiplied by p) pieces of 12-bit parallel data into (n multiplied by p) pieces of 14-bit parallel data, respectively, and output resulting data;
a parallel-to-serial converter circuit configured to parallel-to-serial convert the (n multiplied by p) pieces of 14-bit parallel data into (n multiplied by p) pieces of 1-bit serial data, and output resulting data; and
an m-bit driver circuit configured to amplify and transmit the (n multiplied by p) pieces of 1-bit serial data, as n transmission signals each of m bits, respectively, to q transmission paths, where q is a minimum natural number equal to or larger than (n multiplied by p)/m.

6. The transmitter apparatus as claimed in claim 5,
wherein the dividing buffer comprises a shift register configured to have a storage region of (n multiplied by 12 multiplied by p) bits, and divide data of (n multiplied by 12 multiplied by p) bits into (n multiplied by p) pieces of 12-bit parallel data by a bit shift of (n multiplied by 12) bits with the shift register.

7. The transmitter apparatus as claimed in claim 5,
wherein the m-bit driver circuit is a differential m-bit driver circuit.

8. The transmitter apparatus as claimed in claim 5, further comprising a clock driver circuit configured to transmit a clock signal for synchronization used in the transmitter apparatus to a further transmission path.

9. The transmitter apparatus as claimed in claim 8,
wherein the clock driver circuit is a differential clock driver circuit.

10. A receiver apparatus for receiving natural number n transmission signals each of natural number m bits, and converting n pieces of serial data into n pieces of parallel data, respectively, the receiver apparatus comprising:
an m-bit receiver circuit configured to receive n transmission signals each of natural number m bits from n transmission paths, and generate n pieces of 1-bit serial data, respectively;
a serial-to-parallel converter circuit configured to serial-to-parallel convert the n pieces of 1-bit serial data into n pieces of 14-bit parallel data, respectively, and generate a clock signal for synchronization from at least one piece of the n pieces of 1-bit serial data; and
a decoder circuit configured to 14B12B-convert the n pieces of 14-bit parallel data into n pieces of 12-bit parallel data, respectively, by using the clock signal for synchronization, and output resulting data.

11. The receiver apparatus as claimed in claim 10,
wherein the m-bit receiver circuit is a differential m-bit receiver circuit.

12. The receiver apparatus as claimed in claim 10, further comprising a clock receiver circuit configured to receive a clock signal for synchronization used in the receiver apparatus from a further transmission path.

13. The receiver apparatus as claimed in claim 12,
wherein the clock receiver circuit is a differential clock receiver circuit.

14. A receiver apparatus for receiving (n multiplied by p) transmission signals each of natural number m bits, and converting (n multiplied by p) pieces of serial data into (n multiplied by p) pieces of 12-bit parallel data, where n and p are natural numbers, the receiver apparatus comprising:
an m-bit receiver circuit configured to receive (n multiplied by p) transmission signals each of natural number m bits from (n multiplied by p) transmission paths, respectively, and generate (n multiplied by p) pieces of 1-bit serial data;
a serial-to-parallel converter circuit configured to serial-to-parallel convert the (n multiplied by p) pieces of 1-bit serial data into (n multiplied by p) pieces of 14-bit parallel data, respectively, and generate a clock signal for synchronization from at least one of the (n multiplied by p) pieces of 1-bit serial data; and
a decoder circuit configured to 14B12B-convert the (n multiplied by p) pieces of 14-bit parallel data into (n multiplied by p) pieces of 12-bit parallel data by using the clock signal for synchronization, and output resulting data.

15. The receiver apparatus as claimed in claim 14, further comprising an output buffer configured to input the (n multiplied by p) pieces of 12-bit parallel data outputted from the decoder circuit and output the inputted data as p pieces of (n multiplied by 12)-bit parallel data,
wherein the output buffer comprises a shift register configured to have a storage region of (n multiplied by 12 multiplied by p) bits, and output the inputted data as p pieces of (n multiplied by 12)-bit parallel data by a (n multiplied by 12)-bit shift with the shift register.

16. The receiver apparatus as claimed in claim 14,
wherein the m-bit receiver circuit is a differential m-bit receiver circuit.

17. The receiver apparatus as claimed in claim 14, further comprising a clock receiver circuit configured to receive a clock signal for synchronization used in the receiver apparatus from a further transmission path.

18. The receiver apparatus as claimed in claim 17, wherein the clock receiver circuit is a differential clock receiver circuit.

19. A serial transmission system comprising a transmitter apparatus and a receiver apparatus,
wherein the transmitter apparatus is configured to convert parallel data of natural number n multiplied by 12 bits into n pieces of serial data, and transmit n transmission signals each of natural number m bits,
wherein the transmitter apparatus comprises:
a dividing buffer configured to divide inputted parallel data into n pieces of 12-bit parallel data;
an encoder circuit configured to 12B14B-convert the n pieces of 12-bit parallel data into n pieces of 14-bit parallel data, respectively, and output resulting data;
a parallel-to-serial converter circuit configured to parallel-to-serial convert the n pieces of 14-bit parallel data into n pieces of 1-bit serial data, respectively, and output resulting data; and
an m-bit driver circuit configured to amplify and transmit the n pieces of 1-bit serial data, as n transmission signals each of m bits, respectively, to n transmission paths,
wherein the receiver apparatus configured to receive natural number n transmission signals each of natural number m bits, and convert n pieces of serial data into n pieces of parallel data, respectively,
wherein the receiver apparatus comprises:
an m-bit receiver circuit configured to receive n transmission signals each of natural number m bits from n transmission paths, and generate n pieces of 1-bit serial data, respectively;
a serial-to-parallel converter circuit configured to serial-to-parallel convert the n pieces of 1-bit serial data into n pieces of 14-bit parallel data, respectively, and generate a clock signal for synchronization from at least one piece of the n pieces of 1-bit serial data; and
a decoder circuit configured to 14B12B-convert the n pieces of 14-bit parallel data into n pieces of 12-bit parallel data, respectively, by using the clock signal for synchronization, and output resulting data.

20. A serial transmission system comprising a transmitter apparatus and a receiver apparatus,
wherein the transmitter apparatus is configured to convert parallel data of natural number p units, whose one unit is parallel data of natural number n multiplied by 12 bits, into (n multiplied by p) pieces of serial data, and transmit n transmission signals each of natural number m bits,
wherein the transmitter apparatus comprises:
dividing buffer configured to divide inputted parallel data into (n multiplied by p) pieces of 12-bit parallel data;
an encoder circuit configured to 12B14B-convert the (n multiplied by p) pieces of 12-bit parallel data into (n multiplied by p) pieces of 14-bit parallel data, respectively, and output resulting data;
a parallel-to-serial converter circuit configured to parallel-to-serial convert the (n multiplied by p) pieces of 14-bit parallel data into (n multiplied by p) pieces of 1-bit serial data, and output resulting data; and
an m-bit driver circuit configured to amplify and transmit the (n multiplied by p) pieces of 1-bit serial data, as n transmission signals each of m bits, respectively, to q transmission paths, where q is a minimum natural number equal to or larger than (n multiplied by p)/m,
wherein the receiver apparatus is configured to receive (n multiplied by p) transmission signals each of natural number m bits, and convert (n multiplied by p) pieces of serial data into (n multiplied by p) pieces of 12-bit parallel data, where n and p are natural numbers,
wherein the receiver apparatus comprises:
an m-bit receiver circuit configured to receive (n multiplied by p) transmission signals each of natural number m bits from (n multiplied by p) transmission paths, respectively, and generate (n multiplied by p) pieces of 1-bit serial data;
a serial-to-parallel converter circuit configured to serial-to-parallel convert the (n multiplied by p) pieces of 1-bit serial data into (n multiplied by p) pieces of 14-bit parallel data, respectively, and generate a clock signal for synchronization from at least one of the (n multiplied by p) pieces of 1-bit serial data; and
a decoder circuit configured to 14B12B-convert the (n multiplied by p) pieces of 14-bit parallel data into (n multiplied by p) pieces of 12-bit parallel data by using the clock signal for synchronization, and output resulting data.

\* \* \* \* \*